(12) United States Patent
Rabkin et al.

(10) Patent No.: US 9,634,097 B2
(45) Date of Patent: Apr. 25, 2017

(54) 3D NAND WITH OXIDE SEMICONDUCTOR CHANNEL

(71) Applicant: SanDisk Technologies Inc., Plano, TX (US)

(72) Inventors: Peter Rabkin, Cupertino, CA (US); Johann Alsmeier, San Jose, CA (US); Masaaki Higashitani, Cupertino, CA (US)

(73) Assignee: SanDisk Technologies LLC, Plano, TX (US)

( * ) Notice: Subject to any disclaimer, the term of this patent is extended or adjusted under 35 U.S.C. 154(b) by 66 days.

(21) Appl. No.: 14/552,964

(22) Filed: Nov. 25, 2014

(65) Prior Publication Data

US 2016/0149004 A1      May 26, 2016

(51) Int. Cl.
| | |
|---|---|
| *H01L 29/24* | (2006.01) |
| *H01L 29/423* | (2006.01) |
| *H01L 27/115* | (2006.01) |
| *H01L 27/1157* | (2017.01) |
| *H01L 27/11578* | (2017.01) |
| *H01L 21/28* | (2006.01) |
| *H01L 29/66* | (2006.01) |
| *H01L 29/786* | (2006.01) |

(Continued)

(52) U.S. Cl.
CPC ........ *H01L 29/24* (2013.01); *H01L 21/28282* (2013.01); *H01L 27/1157* (2013.01); *H01L 27/11578* (2013.01); *H01L 27/11582* (2013.01); *H01L 29/4234* (2013.01); *H01L 29/66969* (2013.01); *H01L 29/7869* (2013.01); *H01L 29/7926* (2013.01); *H01L 21/02565* (2013.01); *H01L 21/02631* (2013.01)

(58) Field of Classification Search
CPC ................................................ H01L 27/11582
See application file for complete search history.

(56) References Cited

U.S. PATENT DOCUMENTS

| 5,936,274 A | 8/1999 | Forbes et al. |
| 6,878,962 B1 | 4/2005 | Kawasaki et al. |

(Continued)

OTHER PUBLICATIONS

Nomura, K. et al., "Thin-Film Transistor Fabricated in Single-Crystalline Transparent Oxide Semiconductor," Science, American Association for the Advancement of Science, US, vol. 300, May 23, 2003, pp. 1269-1272.

(Continued)

*Primary Examiner* — Kimberly Rizkallah
*Assistant Examiner* — Mounir Amer
(74) *Attorney, Agent, or Firm* — Vierra Magen Marcus LLP

(57) ABSTRACT

Disclosed herein are 3D NAND memory devices having an oxide semiconductor vertical NAND channel and methods for forming the same. The oxide semiconductor may have a crystalline structure. The channel of the vertically-oriented NAND string may be cylindrically shaped. The crystalline structure has an axis that may be aligned crystalline with respect to the cylindrical shape of the vertically-oriented channel substantially throughout the vertically-oriented channel. The crystalline structure may have a first axis that is aligned parallel to the vertical channel, a second axis that is aligned perpendicular to a surface of the cylindrically shaped channel, etc.

25 Claims, 31 Drawing Sheets

(51) Int. Cl.
*H01L 29/792* (2006.01)
*H01L 27/11582* (2017.01)
*H01L 21/02* (2006.01)

(56) References Cited

U.S. PATENT DOCUMENTS

| | | | |
|---|---|---|---|
| 7,061,014 | B2 | 6/2006 | Hosono et al. |
| 8,410,838 | B2 | 4/2013 | Kato et al. |
| 8,421,071 | B2 | 4/2013 | Hatano |
| 8,630,110 | B2 | 1/2014 | Endo |
| 8,860,023 | B2 | 10/2014 | Tsubuku et al. |
| 8,866,139 | B2 | 10/2014 | Ino |
| 2007/0272922 | A1 | 11/2007 | Kim et al. |
| 2008/0237687 | A1 | 10/2008 | Kim et al. |
| 2010/0213458 | A1 | 8/2010 | Prall |
| 2012/0187475 | A1 | 7/2012 | Yamazaki et al. |
| 2013/0234130 | A1 | 9/2013 | Ino |
| 2013/0248852 | A1 | 9/2013 | Yokozeki |
| 2013/0270552 | A1 | 10/2013 | Yamazaki et al. |
| 2013/0270568 | A1* | 10/2013 | Rabkin ............... H01L 29/6675 257/66 |
| 2014/0004656 | A1 | 1/2014 | Sasagawa et al. |
| 2014/0204696 | A1 | 7/2014 | Kato et al. |
| 2014/0264525 | A1 | 9/2014 | Takahashi et al. |
| 2014/0269099 | A1 | 9/2014 | Nagatsuka et al. |
| 2014/0273373 | A1 | 9/2014 | Makala et al. |
| 2014/0284697 | A1 | 9/2014 | Wang et al. |
| 2014/0339560 | A1 | 11/2014 | Yamazaki et al. |

OTHER PUBLICATIONS

International Search Report & The Written Opinion of the International Searching Authority dated Feb. 8, 2016, International Application No. PCT/US2015/052075.

Kaneko, K., et al., "Highly Reliable BEOL-Transistor with Oxygen-controlled InGaZnO and Gate/Drain Offset Design for High/Low Voltage Bridging I/O Operations," IEEE International Electron Devices Meeting, Dec. 2011, 4 pages.

Yamazaki, Shunpei, "New crystalline structure yields reliable thin-film transistors," SPIE Newsroom, Sep. 13, 2012, 3 pages.

Yamazaki, Shunpei, "A Possibility of Crystalline Indium-Gallium-Zinc-Oxide," 5th Asia Symposium on Quality Electronic Design, Aug. 27, 2013, Penang, Malaysia, 42 pages.

Yamazaki, Shunpei, et al., "In—Ga—Zn-Oxide Semiconductor and Its Transistor Characteristics," ECS Journal of Solid State Science and Technology, Jul. 7, 2014, 11 pages.

Park, Jae Chul, et al., "High performance amorphous oxide thin film transistors with self-aligned top-gate structure," IEEE Electron Devices Meeting, Dec. 2009, 4 pages.

Hosono, Hideo, "High Performance Thin-film Transistor (TFT) with Amorphous InGaZnO4 Semiconductor," [http://www.jst.go.jp/tt/EN/cips_details/pdf_2/2-3.pdf], Jul. 2012, 1 page.

Kaneko, K., et al., "Operation of Functional Circuit Elements using BEOL-Transistor with InGaZnO Channel for On-chip High/Low Voltage Bridging I/Os and High-Current Switches," Symposium on VLSI Technology, Jun. 2012, 2 pages.

\* cited by examiner

Fig. 4B
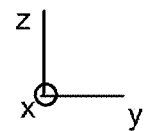
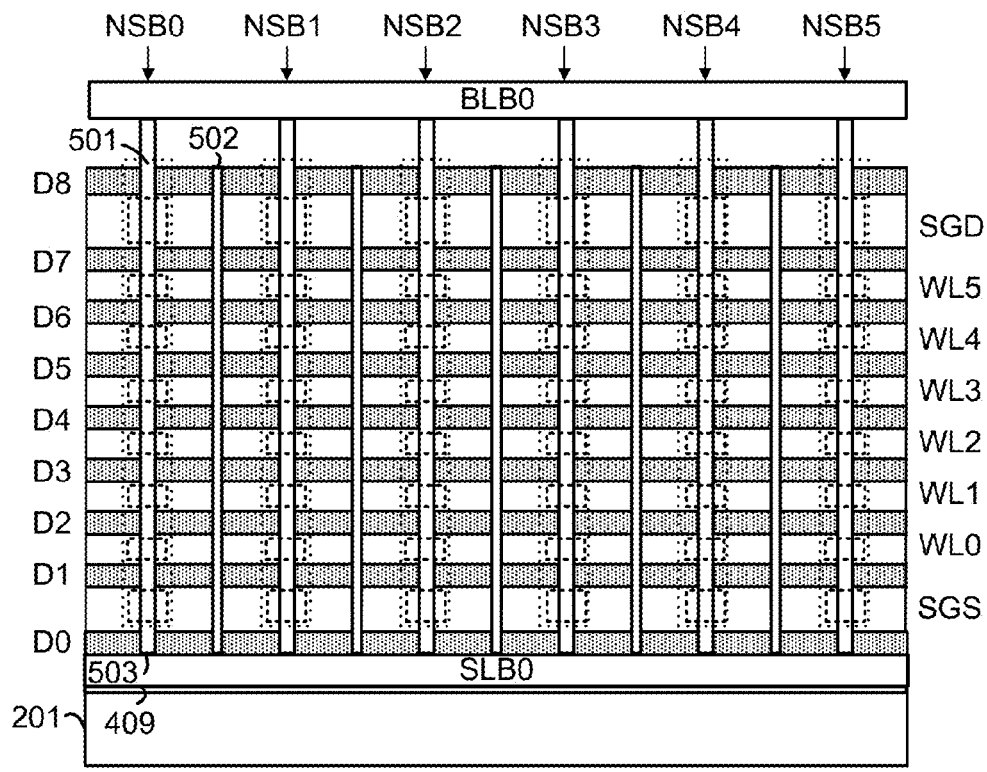

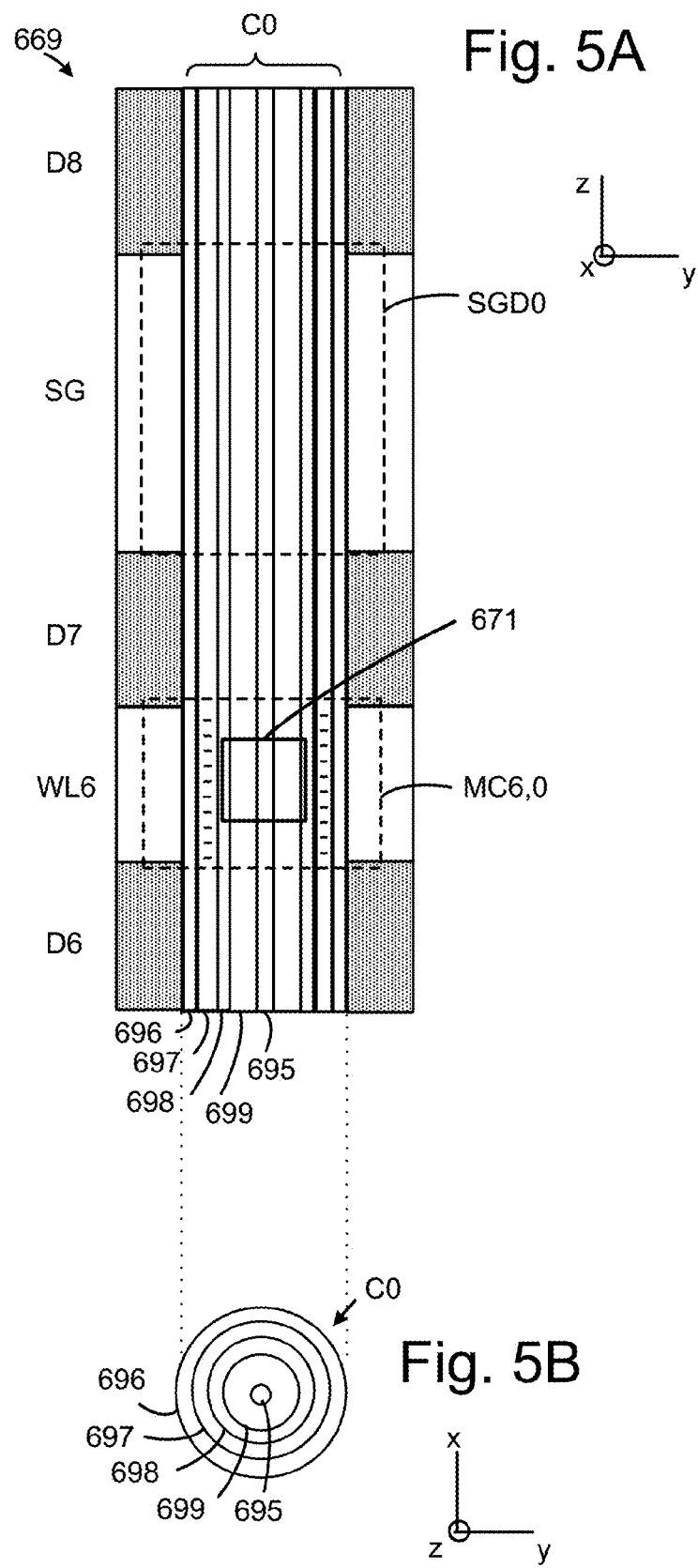

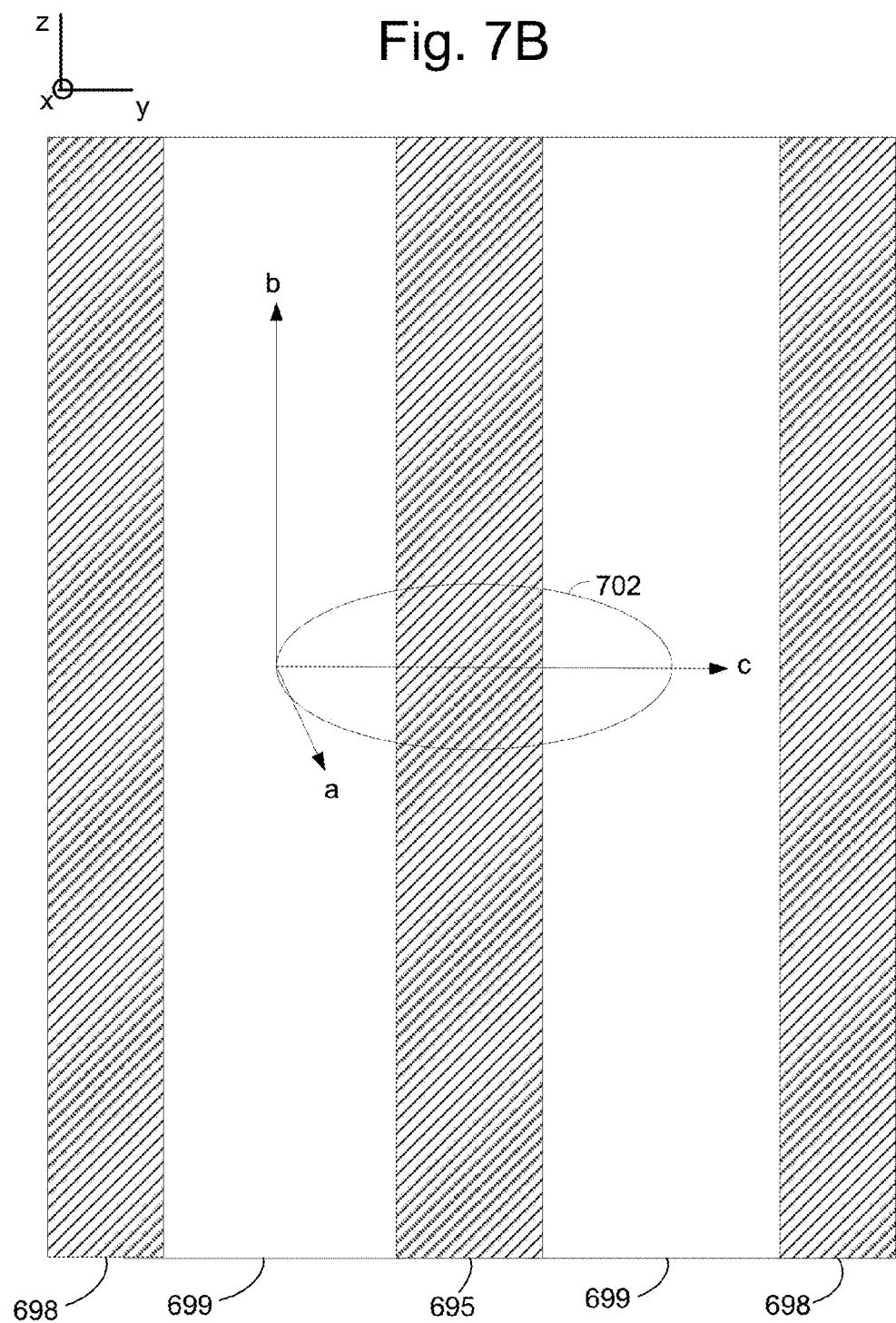

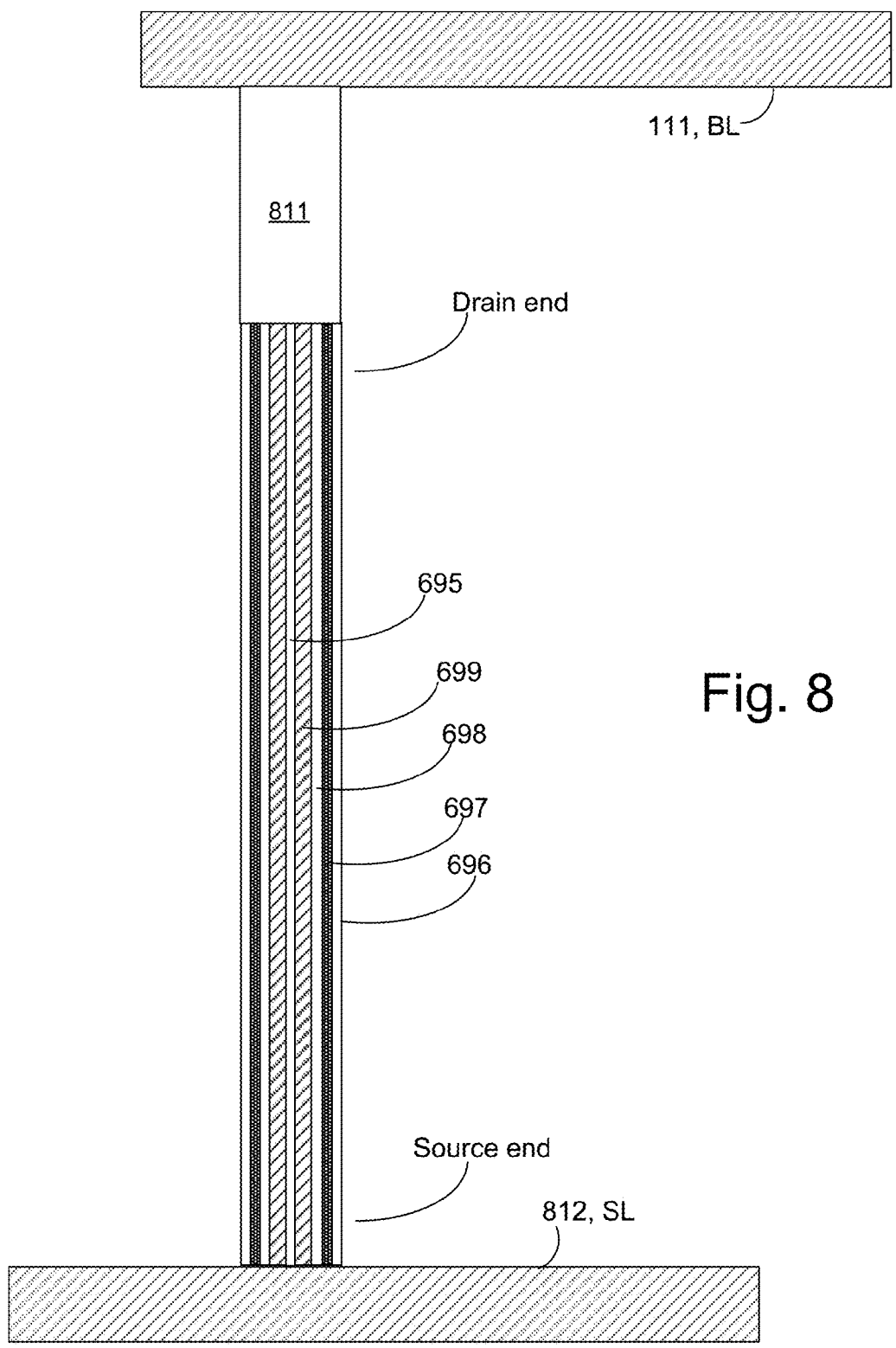

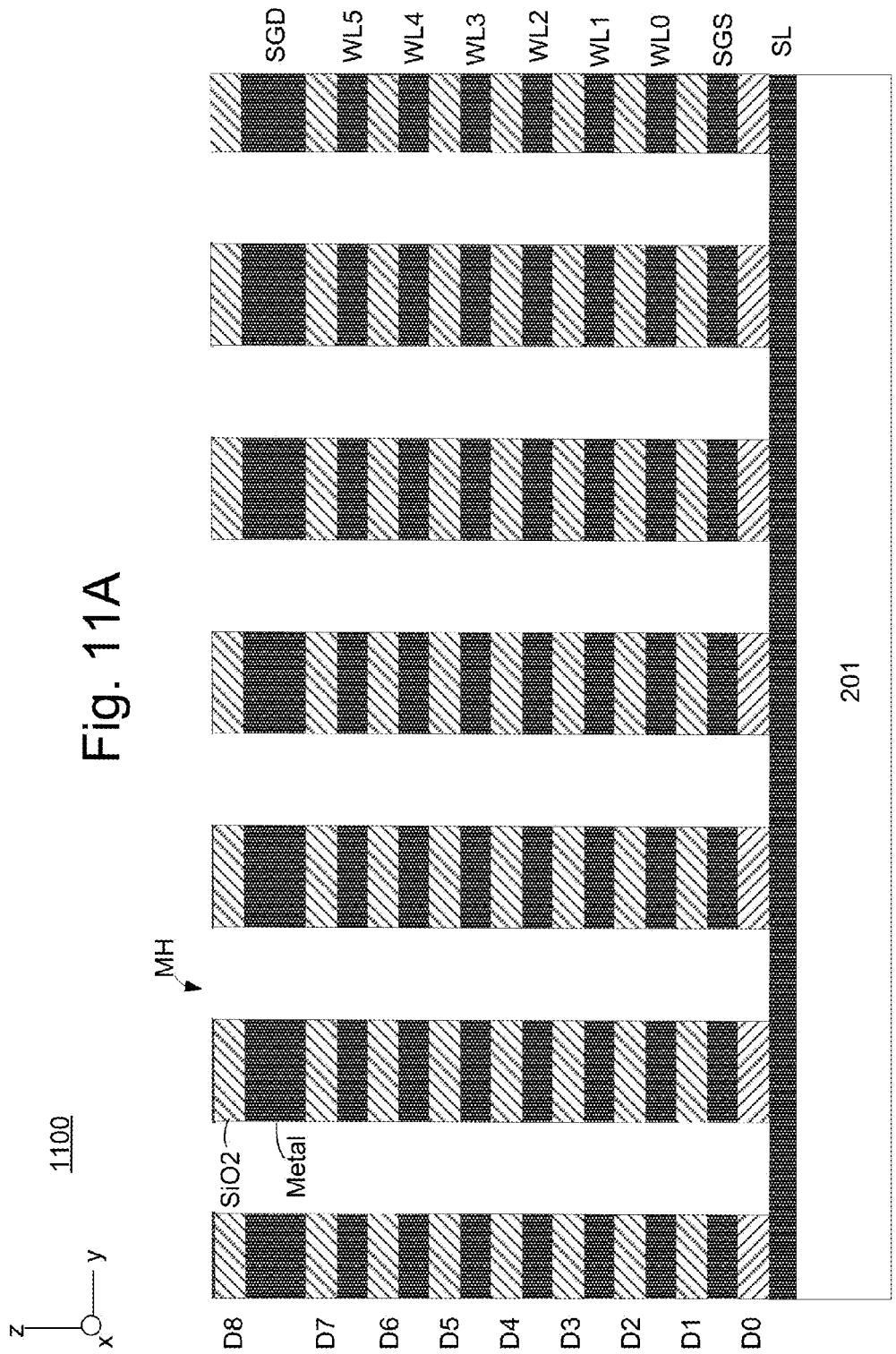

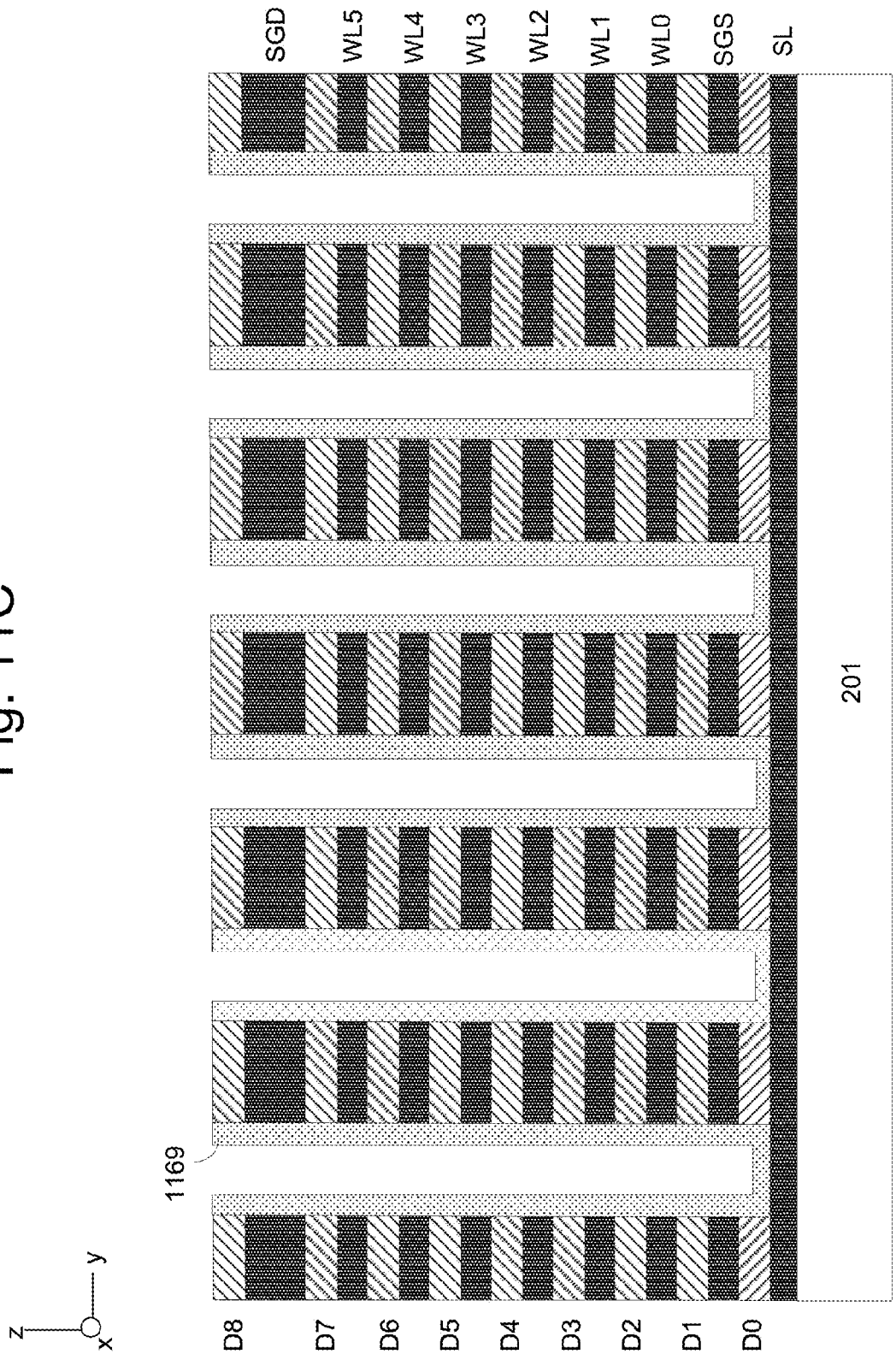

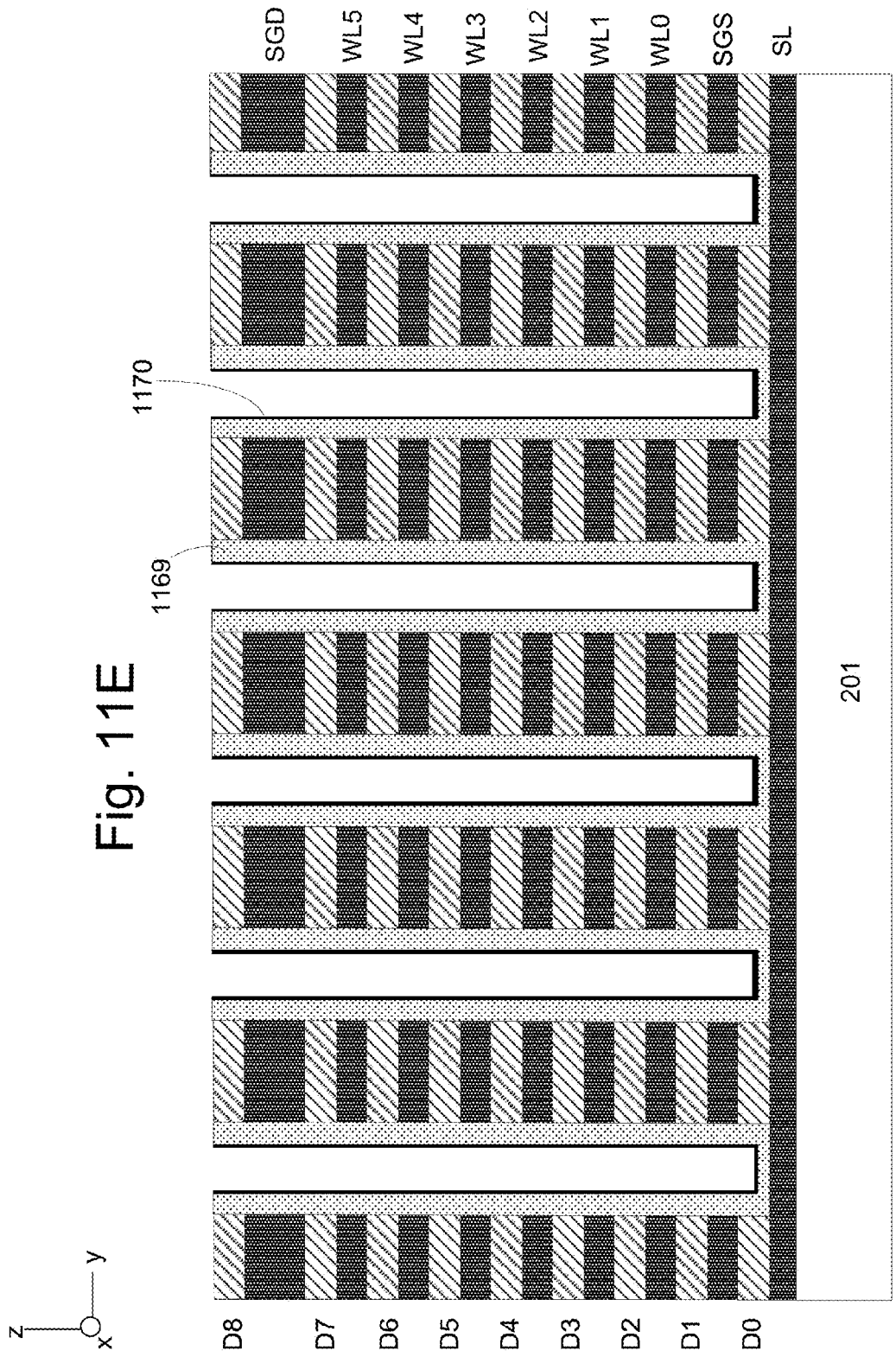

US 9,634,097 B2

3D NAND WITH OXIDE SEMICONDUCTOR CHANNEL

BACKGROUND

The present technology relates to non-volatile memory.

Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A dielectric and back gate may surround the pipe connection forming a back gate transistor to control conduction of the pipe connection. Control gates of the memory cells are provided by the conductor layers.

BRIEF DESCRIPTION OF THE DRAWINGS

Like-numbered elements refer to common components in the different figures.

FIG. 4B depicts a cross-sectional view of a block of the 3D non-volatile memory device of FIG. 4A having straight strings.

FIG. 5A depicts a close-up view of the region 669 of the column C0 of FIG. 3B, showing a drain-side select gate SGD0 and a memory cell MC6,0.

FIG. 5B depicts a cross-sectional view of the column C0 of FIG. 5A.

FIG. 7B is a close up of region 671 from FIG. 5A.

FIG. 8 depicts electrical connections between the oxide semiconductor channel and a bit line and a common source line.

DETAILED DESCRIPTION

Figure 1:
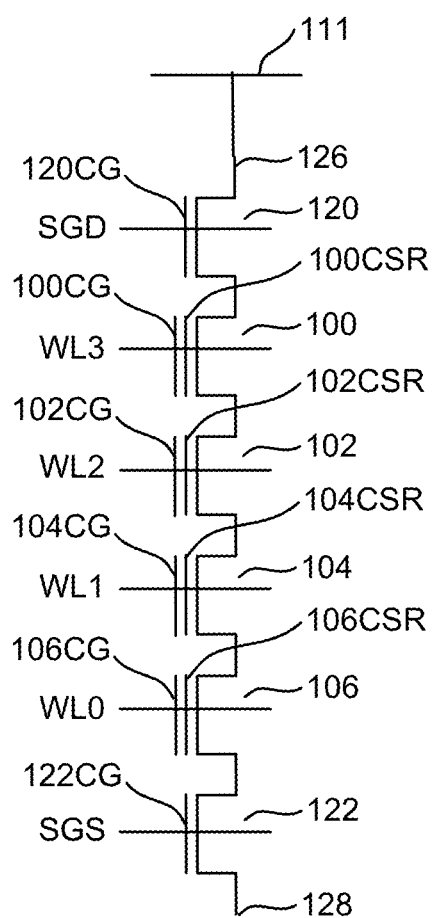
FIG. 1 is a circuit representation of a NAND string.

One parameter of note in 3D NAND memory devices is the "on current" of the memory cell on the NAND string, which is referred to as $I_{CELL}$. A higher $I_{CELL}$ can provide better sensing margin. Another parameter of note in 3D NAND memory devices is the sub-threshold slope, which may be defined as the slope of the Vgs/$I_{CELL}$ curve below the memory cell's threshold voltage. The sub-threshold slope, often measured in mV/decade, generally describes Vgs voltage increase necessary to increase Icell by one order of magnitude. A low slope means that a smaller Vgs increase is needed for a certain Icell increase. When the sub-threshold slope is smaller, the Icell–Vgs curve shows sharper increase of Icell current with every incremental Vgs voltage increase. A low (e.g., relatively flat) slope can make it easier to determine which memory cells are off. Another parameter of note in 3D NAND memory devices is select gate leakage. This refers to leakage of select gates that connect/disconnect the NAND string from a bit line or source line. Another parameter of note in 3D NAND memory devices is band-to-band (BTB) carrier generation. The low BTB carrier generation can significantly improve boosting during programming. Also, low BTB carrier generation can reduce program disturb. This can reduce the need to complicated boosting schemes. This, in turn, can simplify chip design and reduce chip size. Numerous other parameters not specifically discussed in this disclosure are also of interest in 3D NAND memory.

Disclosed herein are 3D NAND memory devices having an oxide semiconductor vertical NAND channel and methods for forming 3D NAND memory devices having an oxide semiconductor vertical NAND channel. In one embodiment, the oxide semiconductor vertical NAND channel is a metal oxide semiconductor. The oxide semiconductor may have a crystalline structure. The oxide semiconductor NAND channel with crystalline structure provides for high $I_{CELL}$, low sub-threshold slope, low select gate leakage, and low BTB carrier generation. Embodiments have high uniformity between NAND strings (i.e., low variability).

Additionally, in one embodiment, the NAND channels having an oxide semiconductor with crystalline structure in a 3D NAND memory device are fabricated without a high temperature anneal. High temperatures during fabrication can harm elements such as transistors. For example, CMOS transistors that are formed in a peripheral region of the memory device prior to the 3D NAND memory array could be harmed during a high temperature anneal associated with formation of 3D memory devices. However, the NAND channel is formed in one embodiment without a high temperature anneal.

One embodiment includes a three-dimensional (3D) non-volatile storage device with vertically-oriented NAND strings. The channel of the vertically-oriented NAND string comprises an oxide semiconductor having a crystalline structure, in one embodiment. The channel of the vertically-oriented NAND string may be cylindrically shaped. The cylindrically shaped channel may be surrounded by non-volatile storage elements. The crystalline structure has an axis that is aligned crystalline with respect to the cylindrical shape of the vertically-oriented channel substantially throughout the vertically-oriented channel, in one embodiment. For example, an axis of the crystal structure could be aligned parallel to the vertical direction of the channel. As another example, an axis of the crystal structure could be aligned perpendicular to a surface of the cylindrical shape that is adjacent to the non-volatile storage elements. The crystal structure does not have discernible grain boundaries, in one embodiment. Examples of oxide semiconductors include, but are not limited to, InGaZnO, InZnO, HflnZnO, ZrInZnO, ZnSnO, InSnO, ZnInSnO, InGaO, ZrInZnO.

The oxide semiconductor may be a wide band gap oxide semiconductor. Herein, a "wide band gap oxide semiconductor" is defined as any oxide semiconductor that has an energy band gap that is wider than silicon. Silicon may have an energy band gap of about 1.1 eV. Some wide band gap oxide semiconductors may have an energy band gap of about 3 eV or greater. However, the wide band gap oxide semiconductor could have an energy band gap that is less than 3 eV. The wider the energy band gap, the higher the critical field. This means that breakdown voltage may be larger for the same size device, relative to silicon.

Note that NAND channels having polysilicon channels can have a significant number of defects at grain boundaries. These defects may increase leakage, increase BTB carrier generation, reduce cell on current, reduce mobility of charge carriers, and introduce variability of device parameters.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a circuit representation of a NAND string. The NAND string depicted in FIG. 1 includes four transistors 100, 102, 104 and 106 in series and sandwiched between (drain side) select gate 120 and (source side) select gate 122. Select gate 120 connects the NAND string to a bit line 111. Select gate 122 connects the NAND string to source line 128. Select gate 120 is controlled by applying the appropriate voltages to select line SGD. Select gate 122 is controlled by applying the appropriate voltages to select line SGS.

Each of the transistors 100, 102, 104 and 106 has a control gate (CG) and a charge storage region (CSR). For example, transistor 100 has control gate 100CG charge storage region 1600CSR. Transistor 102 includes control gate 102CG and a charge storage region 102CSR. Transistor 104 includes control gate 104CG and charge storage region 104CSR. Transistor 106 includes a control gate 106CG and a charge storage region 106CSR. Control gate 100CG is connected to word line WL3, control gate 102CG is connected to word line WL2, control gate 104CG is connected to word line WL1, and control gate 106CG is connected to word line WL0.

Note that although FIG. 1 shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select gate controlled by select line SGS and connected to its associated bit line by its drain select gate controlled by select line SGD. Bit lines may be shared with multiple NAND strings. The bit line may be connected to a sense amplifier.

The charge storage region (CSR) may utilize a non-conductive dielectric material to store charge in a non-volatile manner. In one embodiment, a triple layer dielectric formed of silicon oxide, silicon nitride and silicon oxide ("ONO") is sandwiched between a conductive control gate and the memory cell channel. For example, the ONO may be $Al_2O_3$—SiN—$SiO_2$. In this example, the SiN is the charge storage region (CSR). The cell is programmed by injecting electrons from the cell channel (or NAND string channel) into the nitride, where they are trapped and stored in a limited region. This stored charge then changes the threshold voltage of the cell in a manner that is detectable. The cell may be erased by injecting holes into the nitride. Cells may be erased by injecting holes into the nitride where they recombine with electrons, and thereby "cancel" or reduce the stored charge. Cells may be also erased by extracting electrons from the nitride, e.g., by applying an electric field making electrons tunnel from nitride to the channel. Cells may be erased by both these mechanisms combined.

Numerous types of materials can be used for the charge storage regions (CSR). In one embodiment, the charge storage regions are conductive floating gates. As one example, the conductive floating gates is formed from polysilicon. This may be heavily doped polysilicon. Other types of non-volatile memory technologies can also be used.

Figure 2:
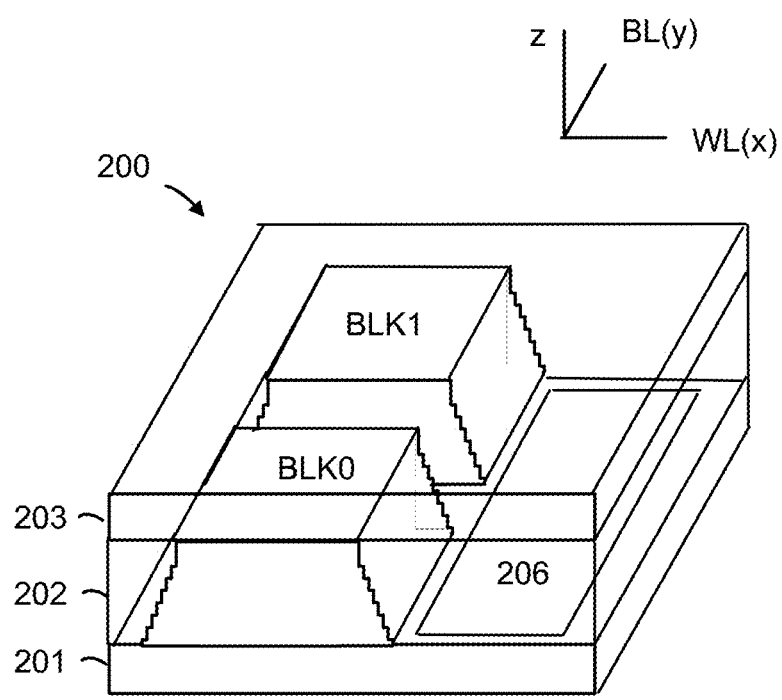
FIG. 2 is a perspective view of a 3D stacked non-volatile memory device.

FIG. 2 is a perspective view of a 3D stacked non-volatile memory device. The 3D memory device 200 includes a substrate 201. In one embodiment, the substrate 201 is formed from silicon. On the substrate are example blocks BLK0 and BLK1 of memory cells and a peripheral area 206 with circuitry for use by the blocks. The substrate 201 can also carry circuitry under the blocks, along with one or more lower metal layers which are patterned in conductive paths to carry signals of the circuitry. The blocks are formed in an intermediate region 202 of the memory device. The circuitry associated with operation of the memory cells may be above or within the substrate 201. In one embodiment, the non-volatile memory device is monolithically formed in one or more physical levels of arrays of memory cells having an active area disposed above the substrate 201.

In an upper region 203 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted, showing an x-direction (or bit line (BL) direction), a y-direction (or word line (WL) direction), as well as a z-direction. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 3A:
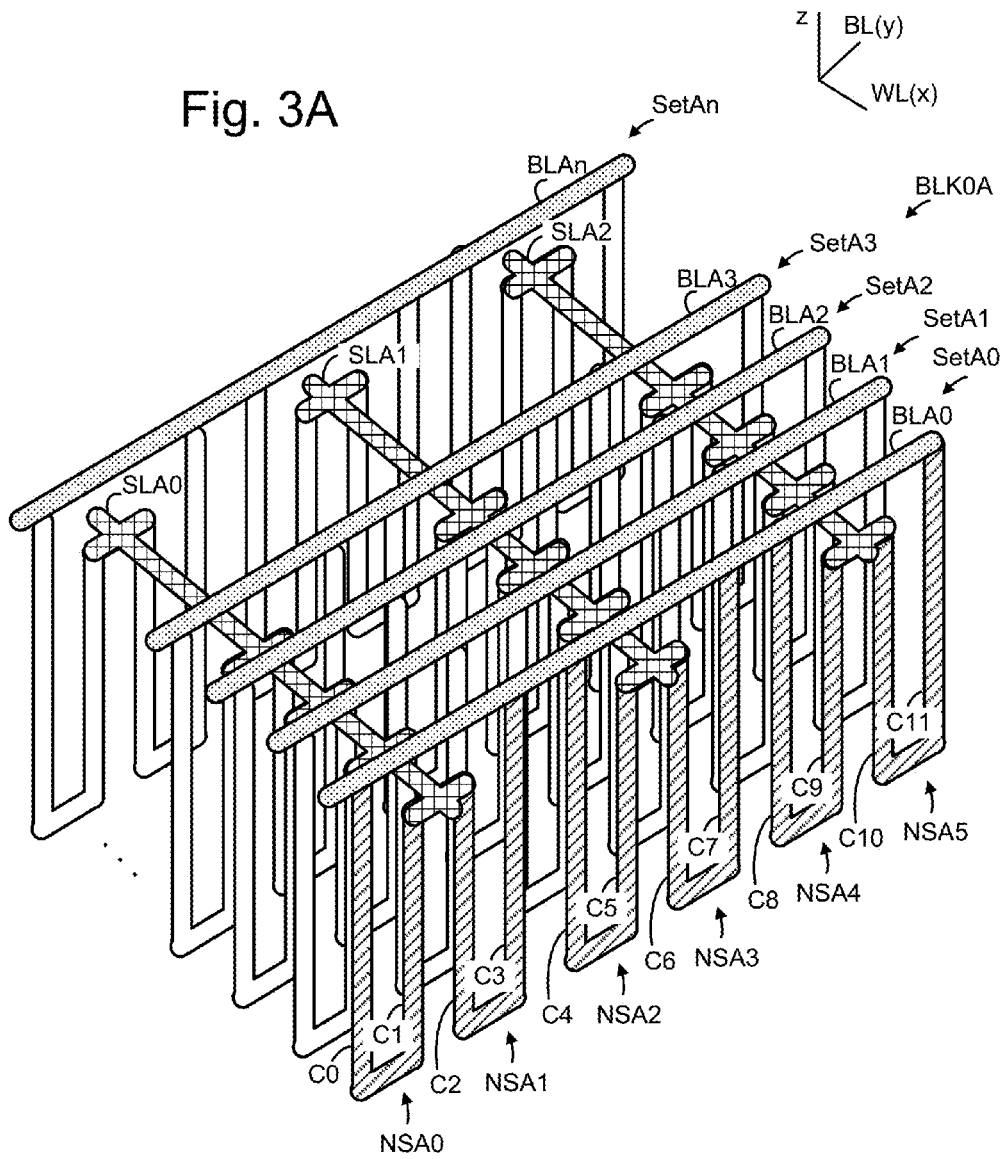
FIG. 3A depicts an embodiment of block BLK0 of FIG. 2 which includes U-shaped NAND strings.

In one embodiment, NAND strings have a U-shape. In another embodiment, NAND strings have a straight shape. FIG. 3A depicts an embodiment of block BLK0 of FIG. 2 which includes U-shaped NAND strings. The block BLK0A includes U-shaped NAND strings arranged in sets (SetA0, . . . , SetAn, where there are n−1 sets of NAND strings in a block). Each set of NAND strings is associated with one bit line (BLA0, BLA1, BLA2, BLA3, . . . , BLAn). In one embodiment, each NAND string has a drain side select gate that is able to connect/disconnect the NAND string from its bit line. The drain side select gates in a set of NAND strings may be individually selectable, such that one NAND string in the set may be selected at a given time. In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

Figure 3B:
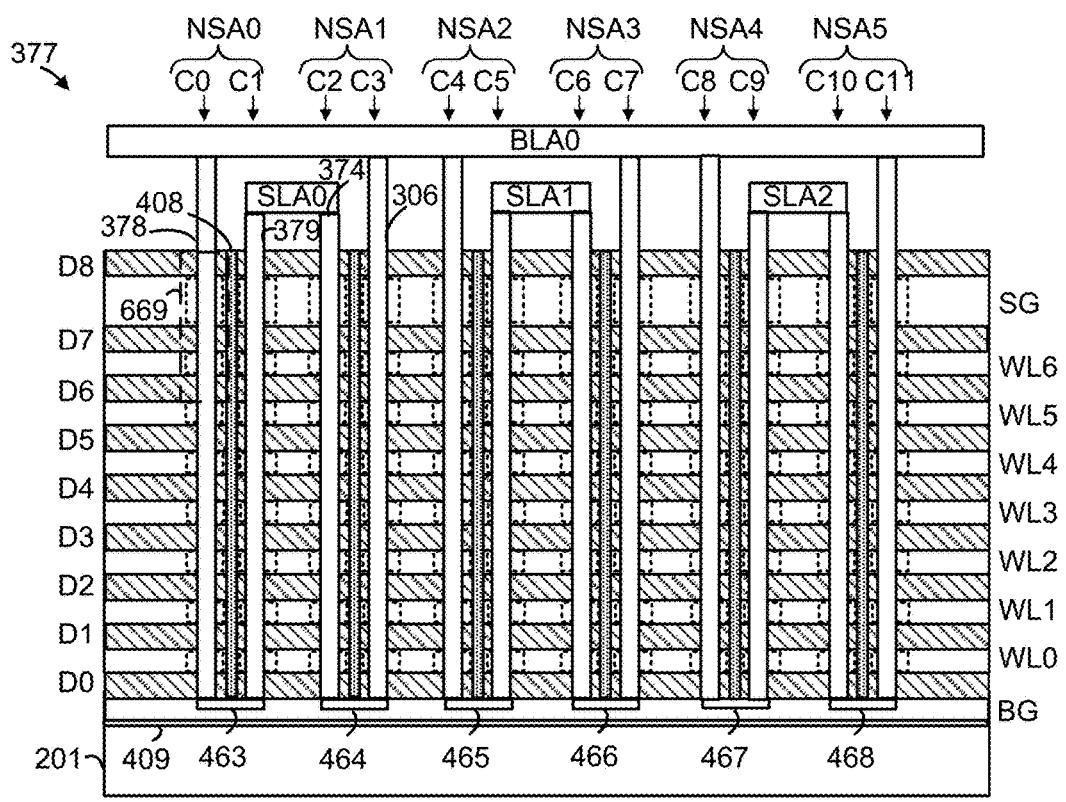
FIG. 3B depicts a cross-sectional view of a block of the 3D non-volatile memory device of FIG. 3A of SetA0 of NAND strings of FIG. 3A.

FIG. 3B depicts a cross-sectional view of a block of the 3D non-volatile memory device of FIG. 3A of SetA0 of NAND strings of FIG. 3A. Columns of memory cells C0 to C11 are depicted in the multi-layer stack. The stack 377 includes the substrate 201, an insulating film 409 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 463 to 468 which connect the columns. The back gate thus connects the two columns of each U-shaped NAND string. For example, NSA0 includes columns C0 and C1 and connecting portion 463. NSA0 has a drain end 378 and a source end 379. NSA1 includes columns C2 and C3 and connecting portion 464. NSA1 has a drain end 306 and a source end 374. NSA2 includes columns C4 and C5 and connecting portion 665. NSA3 includes columns C6 and C7 and connecting portion 466. NSA4 includes columns C8 and C9 and connecting portion 467. NSA5 includes columns C10 and C11 and connecting portion 468.

The source line SLA0 is connected to the source ends 379 and 374 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 377 extend behind the U-shaped NAND strings depicted in the cross-section, e.g., along the x-axis. The U-shaped NAND strings NSA0 to NSA5 are each in a different sub-block, but are in a common set of NAND strings (SetA0).

A slit portion 408 is also depicted as an example. In the cross-section, multiple slit portions are seen, where each slit portion is between the drain- and source-side columns of a U-shaped NAND string. Portions of the source lines SLA0, SLA1, SLA2 are also depicted. A portion of the bit line BLA0 is also depicted.

Short dashed lines depict memory cells and select gates, as discussed further below. Thus, FIG. 3B shows a strings (e.g., NAND strings) of non-volatile storage elements formed above the substrate 201 in multiple physical levels of a three-dimensional memory array. Each of the strings has an active area comprising a channel that extends vertically through the physical levels. Each string comprises non-volatile storage elements and a drain side select gate in the SG layer. A region 669 of the stack is shown in greater detail in FIG. 5A.

Figure 4A:
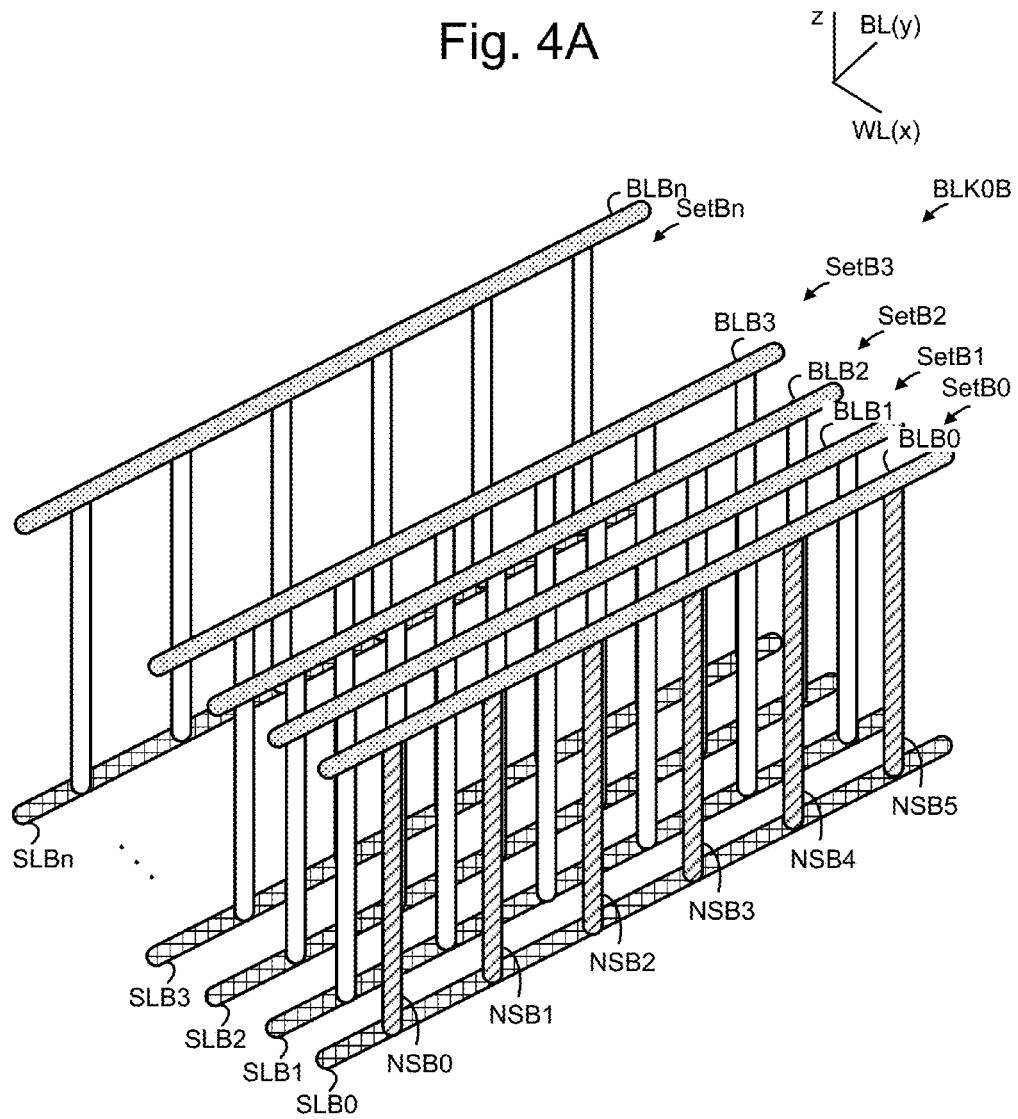
FIG. 4A depicts an embodiment of block BLK0 of FIG. 2 which includes straight NAND strings.

FIG. 4A depicts an embodiment of block BLK0 of FIG. 2 which includes straight NAND strings. The block BLK0B includes straight NAND strings arranged in sets (SetB0, SetB1, SetB2, SetB3, . . . , SetBn, where there are n−1 sets in a block). Each set of NAND strings is associated with one bit line (BLB0, BLB1, BLB2, BLB3, . . . , BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

FIG. 4B depicts a cross-sectional view of a block of the 3D non-volatile memory device of FIG. 4A having straight strings. The view of a portion of setB0 of NAND strings of FIG. 4A. Columns of memory cells corresponding to NAND strings NSB0 to NSB5, respectively, are depicted in the multi-layer stack. The stack 477 includes a substrate 201, an insulating film 409 on the substrate, and a portion of a source line SLB0. Recall that the additional straight NAND strings in a sub-block extend in front of and in back of the NAND strings depicted in the cross-section, e.g., along the x-axis. The NAND strings NSB0 to NSB5 are each in a different sub-block, but are in a common set of NAND strings (SetB0). NSB0 has a source end 503 and a drain end 501. A slit 502 is also depicted with other slits. A portion of the bit line BLB0 is also depicted. Dashed lines depict memory cells and select gates, as discussed further below.

FIG. 5A depicts a close-up view of the region 669 of the column C0 of FIG. 3B, showing a drain-side select gate SGD0 and a memory cell MC6,0. FIG. 5B depicts a cross-sectional view of the column C0 of FIG. 5A. Each layer is shaped as a hollow cylinder in one possible approach, except the core filler which is a solid cylinder. The horizontal cross section of the cylinders may be circular. However, it is not required that the horizontal cross section of the cylinders be circular. In one embodiment, the horizontal cross section of the cylinders is an ellipse. The horizontal cross section of the cylinders could deviate from a perfectly circular or perfectly elliptical shape. Also note that the size (e.g., width) of the column can vary from top to bottom. Thus, the radius of the cylinders could vary from top to bottom. Thus, the term "cylindrical" as used herein does not require a constant radius from top to bottom. This, the term "cylindrical" as used herein allows for some tapering. Recall that region 669 of the column C0 of FIG. 3B is for the U-shaped 3D NAND string example. However, the diagrams and discussion for FIGS. 5A and 5B also apply to a straight 3D NAND string, such as the examples of FIGS. 4A and 4B.

The region 669 shows portions of the dielectric layers D6 to D8 and the conductive layers WL6 and SG. Each column includes a number of layers which are deposited along the sidewalls of the column. These layers can include oxidenitride-oxide and oxide semiconductor layers which may deposited using a variety of techniques. For example, atomic layer deposition could be used to deposit one or more of the layers. For example, a block oxide (or blocking layer) can be deposited as layer 696, a nitride such as SiN as a charge trapping layer (e.g., charge storage region CSR) can be deposited as layer 697, a tunnel oxide (or tunneling layer) can be deposited as layer 698, an oxide semiconductor body or channel can be deposited as layer 699, and a core filler dielectric can be deposited as region 695. The block oxide layer 696 and the tunnel oxide layer 698 may each be formed from several layers of different dielectric materials. In one embodiment, the block oxide layer 696 comprises a layer of $Al_2O_3$ and a layer of $SiO_2$ (the $Al_2O_3$ layer is closer to the word line than the $SiO_2$, in one embodiment). In one embodiment, the tunnel oxide layer 698 comprises a stack of oxide, nitride and oxide films. The oxide semiconductor body or channel 699 may also be referred to as an active area. Additional memory cells are similarly formed throughout the columns.

As will be discussed more fully below, the oxide semiconductor body or channel of the vertical NAND string has a crystalline structure in some embodiments. A vertical NAND string channel having a crystalline structure may have a high $I_{CELL}$, low sub-threshold slope, low select gate leakage, and/or low BTB carrier generation.

When such a memory cell is programmed, electrons are stored in a portion of the charge trapping layer which is associated with the memory cell. For example, electrons are represented by "−" symbols in the charge trapping layer 697 for MC6,0. These electrons are drawn into the charge trapping layer from the oxide semiconductor body, and through the tunnel oxide. The threshold voltage of a memory cell is increased in proportion to the amount of stored charge.

During one embodiment of an erase operation, a voltage in the oxide semiconductor body may be raised due to GIDL, while a voltage of one or more selected word line layers floats. GIDL may occur due to high potential difference between bit line bias and drain side select gate bias (SGD), and similarly, between source line bias and source side select gate bias (SGS). The voltage of the one or more selected word line layers is then driven down sharply to a low level such as 0 V to create an electric field across the tunnel oxide which may cause holes to be injected from the memory cell's body to the charge trapping layer and recombine with electrons. Also, electrons can tunnel from the charge trapping layer to the positively biased channel. One or both of these mechanisms may work to remove negative charge from the charge trapping layer and result in a large Vth downshift toward an erase-verify level, Vv-erase. This process can be repeated in successive iterations until an erase-verify condition is met. For unselected word lines, the word lines may be floated but not driven down to a low level so that the electric field across the tunnel oxide is relatively small, and no, or very little, hole tunneling will occur. If word lines are floated, they will be electrically coupled to the channel. As a result their potential will rise resulting in low potential difference between channel and respective word lines. Memory cells of the unselected word lines will experience little or no Vth downshift, and as a result, they will not be erased. Other techniques may be used to erase.

The oxide semiconductor channel 699 comprises a crystalline structure, in one embodiment. The crystalline structure has a set of atoms arranged in a particular way. Moreover, the crystalline structure periodically repeats in three dimensions on a lattice. In one embodiment, the entire vertical NAND channel 699 is formed from a single crystal of the oxide semiconductor (e.g., monocrystalline).

A semiconductor film may be classified roughly into a crystalline-type or amorphous. Crystalline-type semiconductor films can be single-crystal or a non-single-crystal semiconductor films. The non-single-crystal semiconductor films include, but are not limited to, microcrystalline semiconductor films, polycrystalline semiconductor films, and single-axis aligned semiconductor films. An example of a single axis-aligned semiconductor film is c-axis aligned crystalline oxide semiconductor (CAAC-OS) film (e.g. IGZO and the like).

An amorphous semiconductor film has disordered atomic arrangement and no crystalline component. An example is a semiconductor film in which no crystal part exists even in a microscopic region, and the whole of the semiconductor film is amorphous.

A non-single crystal semiconductor film can be crystalline to a different degree. For instance, a poly-crystalline semiconductor film is comprised of poly "grains". Within each grain, the material is in crystalline phase. That is, within each grain, the crystalline structure is oriented in the same way. However, in different grains, the crystal orientation may be different. A poly-crystalline semiconductor film may include micro-crystals or nano-crystals (the terminology depends on the grain size). Thus, a poly-crystalline semiconductor film has a higher degree of atomic order than the amorphous oxide semiconductor film. Hence, the density of defect states of the poly-crystalline semiconductor film is lower than that of the amorphous semiconductor film.

Another form of crystallinity of semiconductor films is a single-axis aligned oxide semiconductor. One such example is c-axis aligned crystalline oxide semiconductor or CAAS-OS. The CAAC-OS film is one of the semiconductor films that includes a plurality of crystal parts. The density of defect states of the CAAC-OS film is lower than that of the poly-crystalline semiconductor film. Therefore, CAAC-OS may have higher mobility as compared to poly-semiconductor. CAAC-OS has no discernible grain boundaries in at least in one plane, so it exhibits even higher degree of crystallinity than a poly-crystalline semiconductor.

Figure 6A:
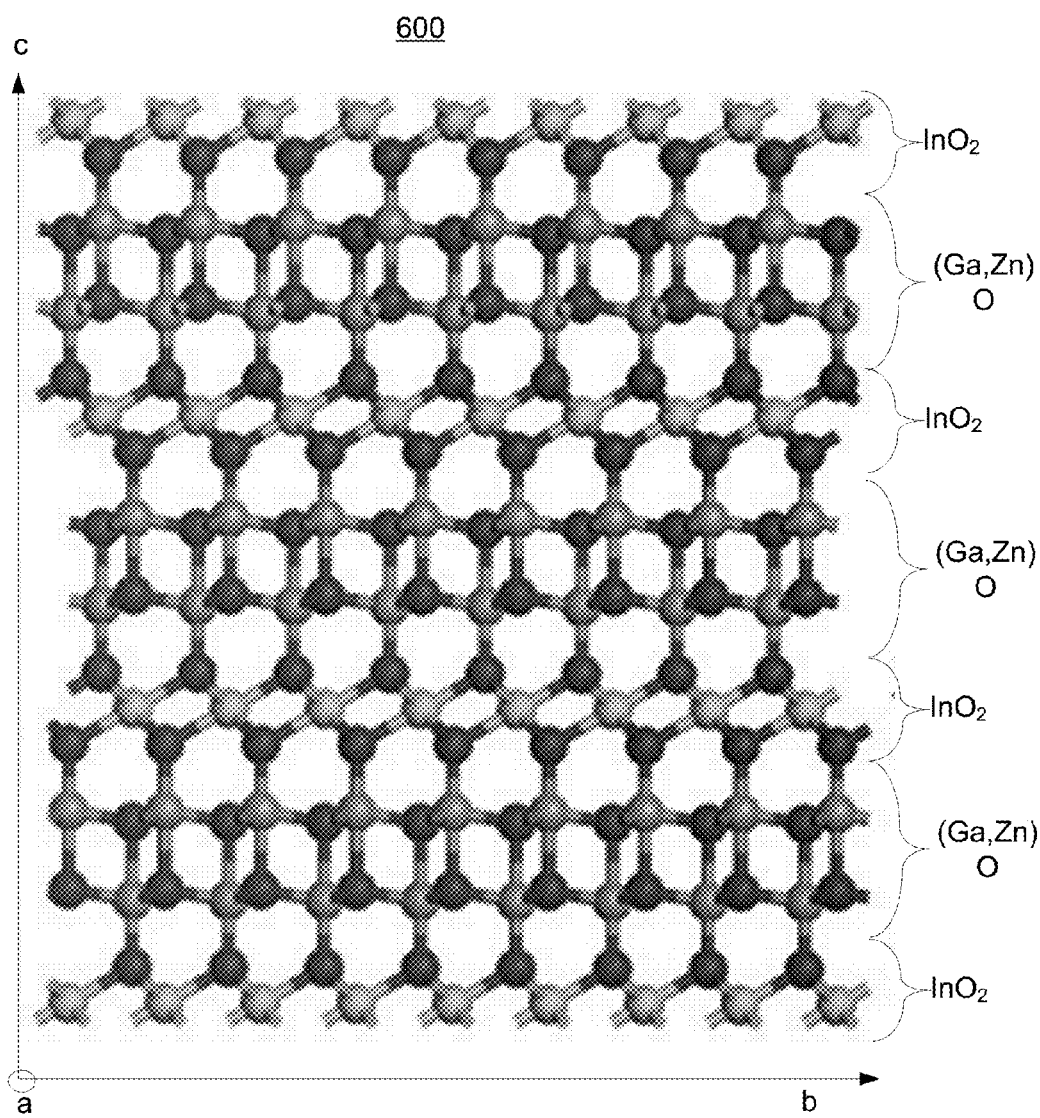
FIG. 6A is a diagram of one embodiment of a crystalline structure of the oxide semiconductor channel.

FIG. 6A is a diagram of one embodiment of a crystalline structure 600 of the oxide semiconductor channel 699. In this embodiment, the oxide semiconductor is InGaZnO. However, the oxide semiconductor could be other materials such as, but not limited to, InZnO, HfInZnO, ZrInZnO, and ZnInSnO. FIG. 6A shows that the crystalline structure 600 has an a-, b-, and c-axis. The crystalline structure 600 has layers of $InO_2$ in the ab-plane. These $InO_2$ layers alternate with layers of (Ga,Zn)O, which are also in the ab-plane. Each of the ab-planes has atoms arranged in a crystalline pattern. The c-axis corresponds to the direction in which the layers are stacked. The c-axis is perpendicular to the ab-planes.

Figure 6B:
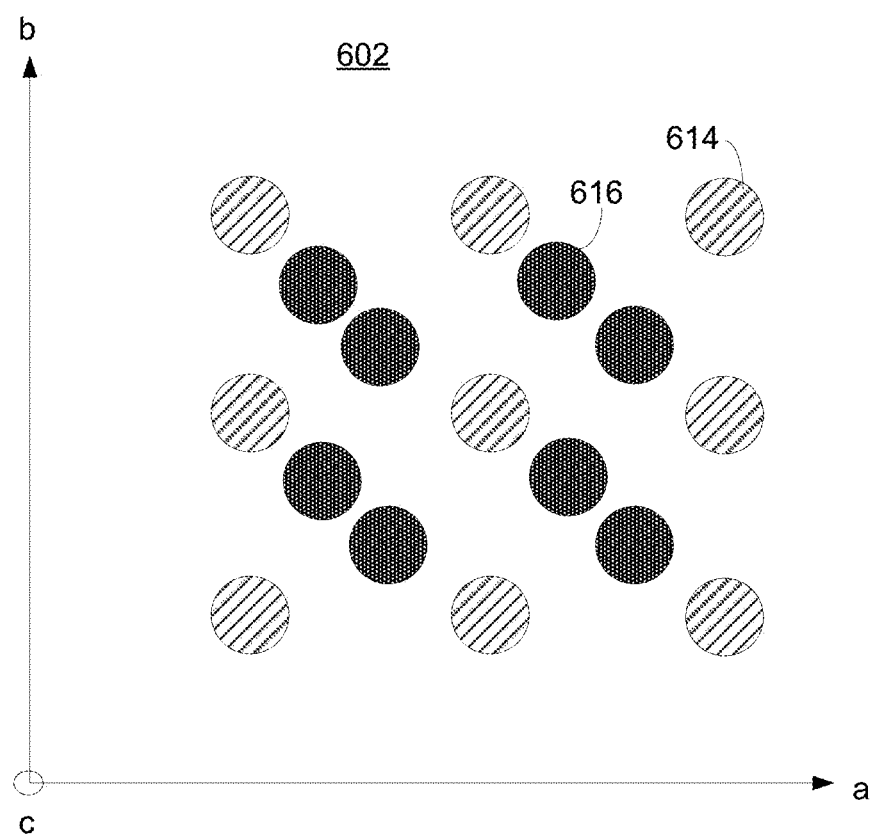
FIG. 6B shows a crystalline layer (or segment) of the crystalline structure of FIG. 6A.

FIG. 6B shows a crystalline layer (or segment) 602 of the crystalline structure 600 of FIG. 6A. Specifically, it shows an example of the $InO_2$ layer in the ab-plane. The crystalline layer 602 shows indium atoms 614 and oxygen atoms 616 in an orderly mosaic pattern. This crystalline layer 602 may be planar or substantially planar. Referring back to FIG. 6A, note that some of the oxygen atoms 616 may be "above" the indium atoms 614 with respect to the c-axis, and some of the oxygen atoms 616 may be "below" the indium atoms 614 with respect to the c-axis.

FIGS. 6A and 6B shows how the crystalline structure 600 is oriented with respect to the a-, b-, and c-axis. In one embodiment, the crystalline structure 600 of the oxide semiconductor channel 699 has multiple crystal domains without clear grain boundaries between the crystal domains. Each of the crystal domains has an orientation as defined by the a-, b-, and c-axis. Each of the crystal domains may have an axis that is oriented in the same direction with respect to the oxide semiconductor channel 699, in one embodiment. For example, the b-axis of each crystal domain may be oriented parallel to the vertical channel direction. By the vertical channel direction in this context, it is meant the direction from top to bottom of the channel along which the storage elements are chained.

Figure 7A:
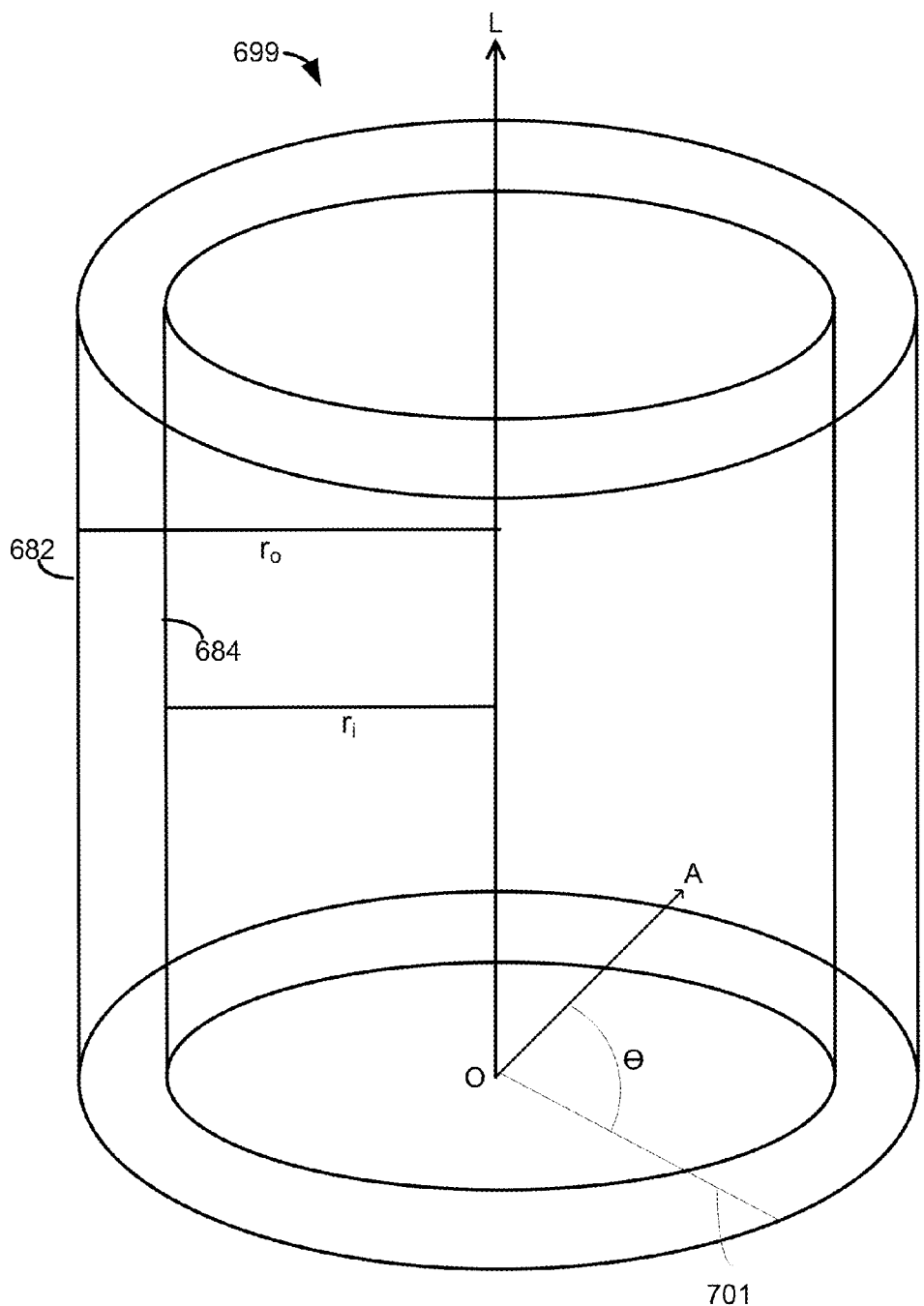
FIG. 7A is a diagram to illustrate the cylindrical shape of one embodiment of an oxide semiconductor channel of the vertical NAND string.

FIG. 7A is a diagram to illustrate the cylindrical shape of one embodiment of an oxide semiconductor channel 699 of the vertical NAND string. The oxide semiconductor channel 699 is a hollow cylinder, in this example. A coordinate system is depicted with an origin O, an L-axis and an A-axis. The origin is shown at the base of the oxide semiconductor channel 699, as an arbitrary point of reference. The L-axis runs vertically along the center of the hollow cylinder. The L-axis may also be referred to as a vertical axis. The L-axis may also be referred to as a longitudinal axis. The vertical NAND channel runs parallel to the L-axis. The A-axis may also be referred to as a radial axis. The A-axis extends horizontally from the L-axis, and is perpendicular to the L-axis. Also, a line 701 is shown as extending from the origin at an angle θ from the A-axis. A radial direction is defined herein by a line that is defined by the A-axis or some angle θ from the A-axis. Line 701 is one example of a line in the radial direction. The radial direction also include lines that originate from the L-axis above the origin and extend horizontally outward.

An inner radius $r_i$ and an outer radius $r_o$ are depicted. Thus, the oxide semiconductor channel 699 has an outer cylindrical surface 682 defined by the outer radius $r_o$ and an inner cylindrical surface 684 defined by the inner radius $r_i$, in this embodiment. Note that the radii are not required to be constant in length from top to bottom of the cylinder. Thus, the cylinder may have some taper. The outer cylindrical surface 682 may be in direct contact with the tunnel oxide layer 698 (not depicted in FIG. 7A). The inner cylindrical surface 684 may be in direct contact with the core filler dielectric 695 (not depicted in FIG. 7A).

FIG. 7B is a close up of region 671 from FIG. 5A. FIG. 7B shows a portion of the oxide semiconductor channel 699 of the vertical NAND string, a portion of the tunnel oxide layer 698, and a portion of the core filler dielectric 695. The core filler dielectric 695 is optional. Thus, the oxide semiconductor channel 699 could be a solid core as another alternative. FIG. 7B also shows a circle 702 and three lines labeled "a", "b" and "c", respectively. The circle 702 represents a horizontal cross section of the vertically-oriented NAND channel 699.

In one embodiment, a crystalline structure 600 of the oxide semiconductor has an axis that is aligned with respect to the cylindrical shape of the vertically-oriented NAND channel 699. The vertical NAND channel 699 may have a number of crystal domains, each having the crystalline structure 600. The density of defect states of the axis aligned film is lower than that of the poly-crystalline oxide semiconductor film. The axis of the crystalline structure is aligned in a particular direction with respect to the cylindrical shape substantially throughout the vertical NAND channel 699, in one embodiment.

The crystalline structure 600 has an axis (e.g., a-, b-, or c-axis of FIGS. 6A, 6B) that is that is aligned crystalline with respect to the cylindrical shape of the vertically-oriented channel substantially throughout the vertically-oriented channel, in one embodiment.

In one embodiment, the axis of the crystalline structure 600 that is aligned crystalline with respect to the cylindrical shape of the vertically-oriented channel is in a direction that is parallel to the direction of the vertically-oriented channel 699. For example, the b-axis of the crystalline structure 600 is aligned parallel to the direction of the vertically-oriented channel 699 in one embodiment. Stated another way, the b-axis of the crystalline structure 600 is parallel to the L-axis in FIG. 7A. FIG. 7B indicates this alignment by the arrow labeled "b". This indicates that at the base of the arrow labeled "b", the crystal structure 600 has its b-axis in the longitudinal direction. Note that this may refer to a crystal domain. Note that there may be multiple crystal domains in the vertical NAND channel, each with its respective b-axis so aligned. Thus, FIG. 7B is showing just one representative point in the vertical NAND channel 699.

As noted above, the vertically-oriented cylindrically shaped channel 699 has a cylindrical surface 682 that is adjacent to the tunnel dielectric 698 of the non-volatile storage elements. The cylindrical surface 682 may be in direct contact with the tunnel dielectric 698. The axis of the crystalline structure 600 that is aligned crystalline with respect to the cylindrical shape of the vertically-oriented channel substantially throughout the vertically-oriented channel 699 is in a direction that is perpendicular to the cylindrical surface 682, in one embodiment. In one embodiment, the c-axis of the crystalline structure 600 is aligned parallel to either the A-axis or a line such as line 701 that is offset some angle θ from the A-axis. FIG. 7B indicates this alignment by the arrow labeled "c". Note that there may be multiple crystal domains, each with their respective c-axis so aligned.

Figure 7C:
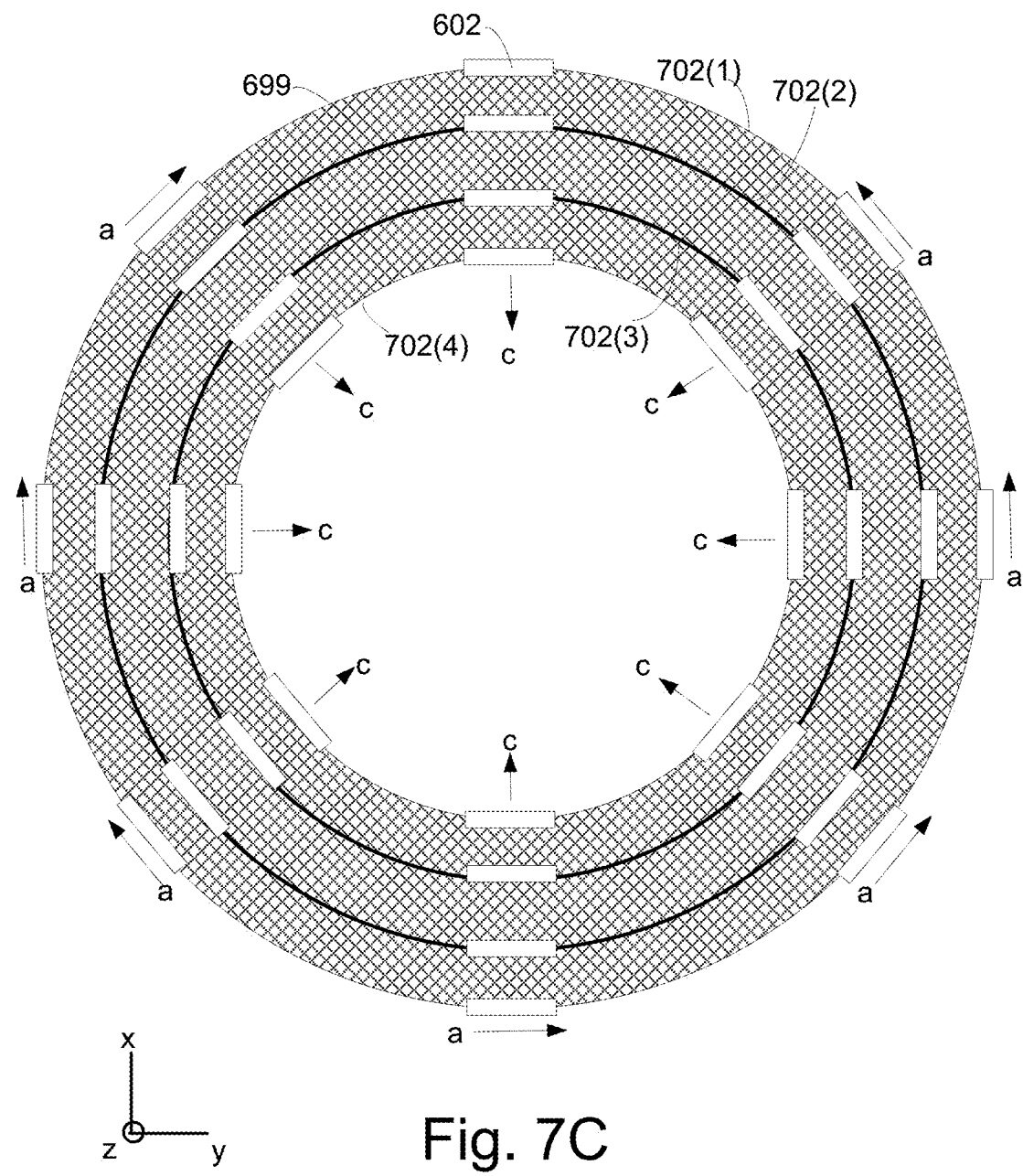
FIG. 7C depicts a horizontal cross section of one embodiment of an oxide semiconductor channel.

FIG. 7C depicts a horizontal cross section of one embodiment of an oxide semiconductor channel 699 of the vertical NAND string to help further illustrate the orientation of the crystal structure with respect to the cylindrical shape. The diagram shows several circles or rings 702(1)-702(4), which are meant to indicate several of concentric cylindrical layers. The diagram illustrates how crystalline layers (e.g., 602, FIG. 6B) may be oriented with respect to the cylindrical shape of the channel 699. The crystalline layers 602 are not drawn to scale.

The crystalline layers 602 are substantially aligned with concentric cylindrical layers of the vertical NAND channel 699, in one embodiment. In one embodiment, crystalline layers 602, such as $InO_2$ layers are aligned with these concentric cylindrical layers 702. Stated another way, the a-axis of a crystalline layer 602 is substantially tangent to one of the rings 702. This is represented in FIGS. 7B and 7C by the arrows labeled "a". Note that there may be many crystal domains, each of which may have its a-axis aligned as depicted in FIG. 7C. Thus, the a-axes of the crystal domains may, in effect, form a ring. However, note that there is not a discernable grain boundary between the crystal domains, in one embodiment.

The b-axis of the crystalline layers 602 is substantially parallel to the concentric cylindrical layers in the longitudinal direction (e.g., L-axis). This is represented in FIG. 7B by the arrow labeled "b". Although the b-axis is not depicted in FIG. 7C, the b-axis is perpendicular to both the a-axis and the c-axis, in one embodiment. (Both the a-axis and the c-axis in the x-y plane, in FIG. 7C.) Thus, the b-axis is parallel to the z-axis in FIG. 7C. Note that there may be many crystal domains, each of which may have its b-axis aligned as depicted in FIG. 7B (and as described with respect to FIG. 7C). However, note that there is not a discernable grain boundary between the crystal domains, in one embodiment.

Additionally, a normal to the crystalline layer 602 is aligned in the radial direction, in one embodiment. This is represented in FIGS. 7B-7C by the arrows labeled "c". Stated another way, the normal to the crystalline layer 602 is perpendicular to one of the rings 702(1)-702(4). Stated still another way, the normal to the crystalline layer 602 is perpendicular to the outer cylindrical surface 682 (see FIG. 7A). Note that there may be many crystal domains, each of which may have its c-axis aligned as depicted in FIG. 7B-7C. However, note that there is not a discernable grain boundary between the crystal domains, in one embodiment.

Thus, at least one of the axes of the crystal structure 600 is aligned with one of the lines labeled "a", "b" and "c" in FIGS. 7B-7C, in one embodiment. As noted, multiple crystal domains may be aligned as such. For example, substantially all of the crystal domains have an axis (e.g., a-, b-, or c-axis) that is aligned crystalline with respect to one of the lines labeled "a", "b" and "c" in FIGS. 7B-7C. Thus, at least one of the axes of the crystal structure 600 is aligned crystalline with respect to the cylindrical shape of the vertically-oriented channel substantially throughout the vertically-oriented channel, in one embodiment.

Note that in the foregoing examples of the orientation of the crystal structure, the crystal structure of FIGS. 6A-6B are just one example. The oxide semiconductor channel 699 could have many other crystal structures.

FIG. 8 depicts electrical connections between the oxide semiconductor channel 699 and a bit line 111 and a common source line 812. The bit line contact 811 is formed from metal, in one embodiment. Example metals include, but are not limited to, titanium, tungsten, copper, aluminum, molybdenum. Likewise, the bit line 111 is formed from metal, in one embodiment. The oxide semiconductor of the channel 699 of the vertical NAND string is in direct electrical contact with its respective metal bit line contact 811 at the drain end of the NAND string.

Note that there is not a need for a heavily doped polysilicon plug at the drain end of the NAND string to make electrical connection between the channel 699 of the NAND string and the bit line contact 811. By having the metal bit line contact 811 directly contacting the oxide semiconductor channel 699, drain contact and series resistance are reduced. Additionally, the height of the pillar can be reduced. Hence bit line capacitance may be reduced, resulting in overall bit line RC delay reduction and 3D NAND device performance improvement.

The source line 812 is formed from metal, in one embodiment. The source line may be associated with a number of the vertically-oriented NAND strings. The oxide semiconductor of the channel 699 of the NAND string is in direct electrical contact with the metal source line 812 at the source end of the NAND string. This results is low source line resistance, along with 3D NAND device performance improvement. Further, there is no need of an N+ polysilicon source, or complex bottom horizontal SGS (select gate source) transistor that controls conduction between N+ source diffusion and bottom of NAND channel 699. For example, some conventional devices have the source end of the NAND string in direct electrical contact with a polysilicon substrate. A portion of the substrate is heavily doped to create an n+ region (not in direct physical contact with the channel of the NAND string. This n+ region is in direct physical and electrical contact with the metal source lines, which may extend vertically. However, in the embodiment depicted in FIG. 8, the oxide semiconductor of the channel 699 of the NAND string is in direct electrical contact with the metal source line 812 at the source end of the NAND string. In this example, the metal source line 812 extends in a horizontal direction, below the NAND string.

Figure 9:
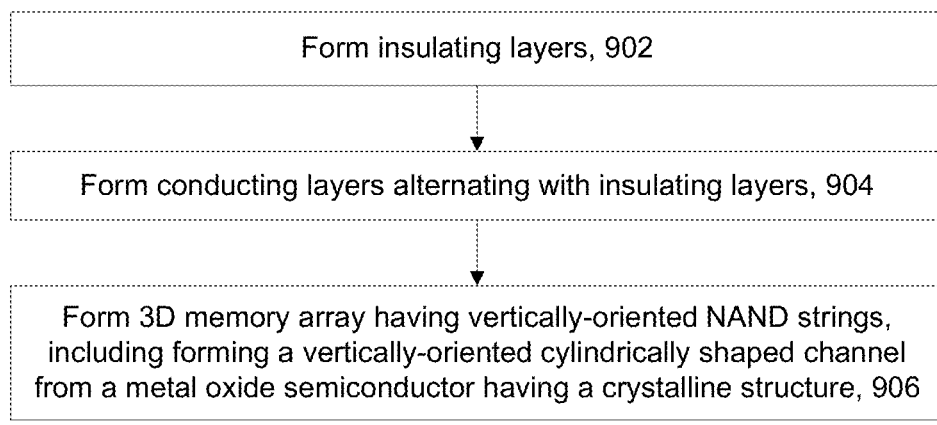
FIG. 9 is a flowchart illustrating one embodiment of fabricating a 3D non-volatile storage device having an oxide semiconductor vertical NAND channel having a crystalline structure.

FIG. 9 is a flowchart illustrating one embodiment of fabricating a 3D non-volatile storage device having an oxide semiconductor vertical NAND channel having a crystalline structure. Step 902 includes forming insulator layers above a substrate. In one embodiment, the insulator layers are formed from $SiO_2$. The insulator is a dielectric in one embodiment.

Step 904 includes forming a plurality of conductive layers alternating with the insulator layers in a stack above the substrate. The conductive layers include word line layers (e.g., WL0-WL5 in FIG. 3B or 4B) and may also include conductive layers for select gates (e.g., SGD, SGS in FIG. 4B or SG in FIG. 3B), as well as other conductive layers such as a back gate layer (BG in FIG. 3B) or source line layer (e.g., SLB0 in FIG. 4B). In one embodiment, the word line layers are heavily doped polysilicon. In one embodiment, the conductive layers are formed from metal, such as, tungsten.

Step 906 includes forming a three-dimensional memory array comprising vertically-oriented NAND strings above the substrate. Each vertically-oriented NAND string comprises a non-volatile storage elements and a vertically-oriented cylindrically shaped channel. Vertically-oriented straight NAND strings such as depicted in FIGS. 4A and 4B are formed in one embodiment. Vertically-oriented U-shaped NAND strings such as depicted in FIGS. 3A and 3B are formed in one embodiment. The vertically-oriented NAND strings are formed within horizontal layers above the substrate. These horizontal layers are alternating layers of conductive material and insulating material, in one embodiment. These horizontal layers are alternating layers of sacrificial material and insulating material, in one embodiment. The sacrificial material may be replaced with conductive material after the NAND strings are formed.

Step 906 comprises forming the vertically-oriented cylindrically shaped channel from an oxide semiconductor having a crystalline structure having an axis that is aligned crystalline with respect to the cylindrical shape of the vertically-oriented channel substantially throughout the vertically-oriented channel. Examples of a crystalline structure 600 having an axis (e.g., a-, b-, or c-axis) that is aligned crystalline with respect to the cylindrical shape of the vertically-oriented channel have been discussed with respect to FIGS. 6A-7C. However, the process of FIG. 9 is not limited to those examples. In one embodiment, the oxide semiconductor is a wide band gap semiconductor.

Figure 10:
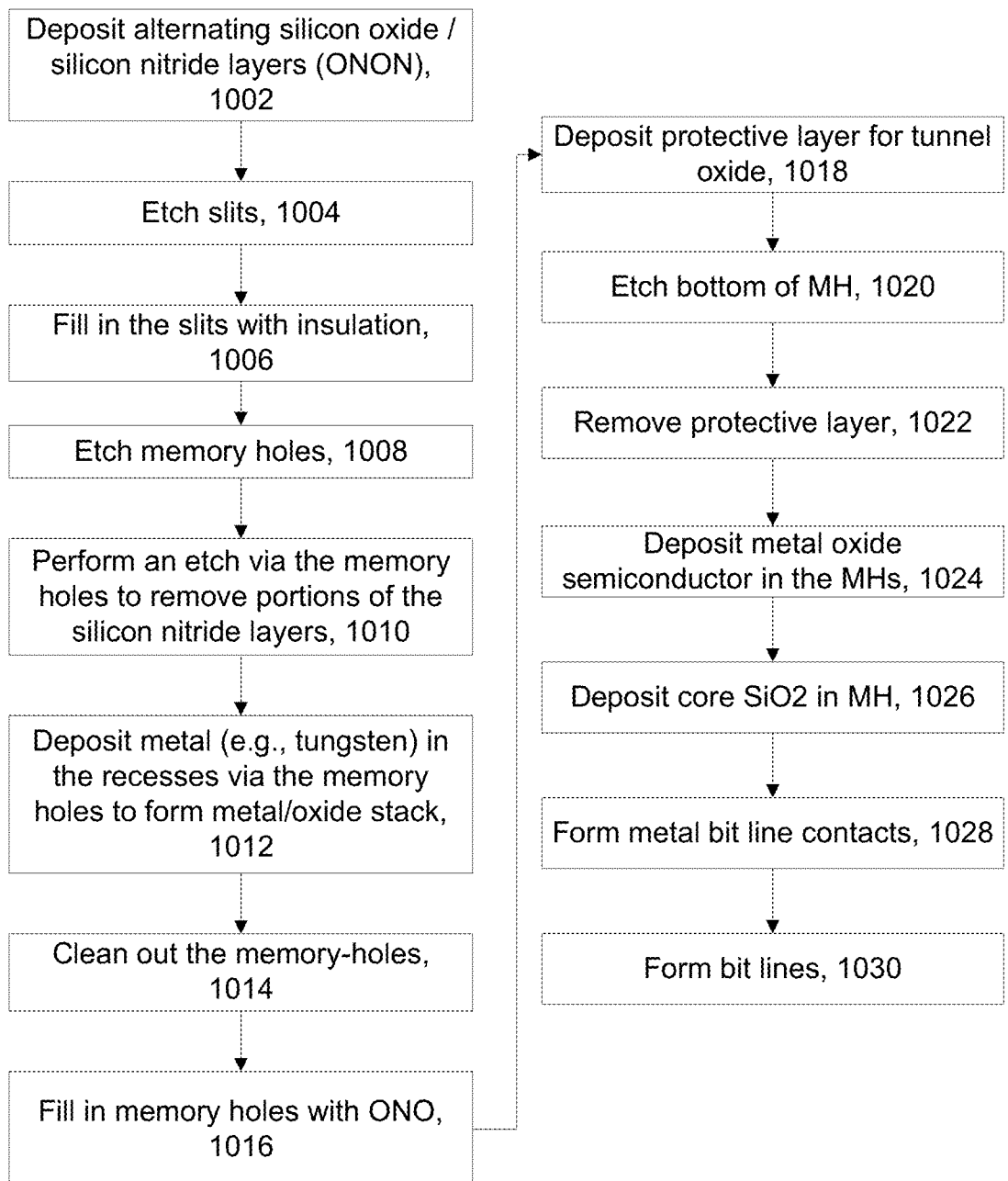
FIG. 10 depicts a method for fabricating a 3D stacked non-volatile memory device.

FIG. 10 depicts a method for fabricating a 3D stacked non-volatile memory device. FIG. 10 provides further details for one embodiment of FIG. 9. In FIG. 10, steps need not necessarily be performed as discrete steps in the order indicated. Various modifications can be made. Moreover, other steps which are known from the art of semiconductor fabrication but are not explicitly depicted here may also be performed.

FIGS. 11A-11J shows formation after various steps of the process of FIG. 10. FIGS. 11A, 11C, 11E, 11G, 11H and 11J show vertical NAND string formation from a perspective similar to FIG. 4B. FIGS. 11B, 11D, 11F and 11I show a horizontal cross section along layer D8.

Prior to this process, below-stack circuitry and metal layers may be formed on substrate. Various circuits may be formed in the substrate 201. For example, a metal layer M0 can be used, e.g., for power line and global control signals, and a metal layer M1 can be used, e.g., for bit line and bus signals. In some cases, to make signal routing easier and to save area, a third metal (M2) can also be used, e.g., a total of three (or more) metal layers under the array. The metal layers can be fabricated from a patterned metal film. For example, Aluminum can be used for the top metal layer, while the other layers are Tungsten. Potentially, Cu can be used instead of Al for upper layer, using a corresponding integration scheme. For silicidation, Ni, Ti, Co or W can be used, for instance.

Step 1002 includes depositing alternating silicon oxide ($SiO_2$)/silicon nitride (SiN) layers above the substrate 201. The silicon nitride is a sacrificial layer, which will be replaced by metal to form word lines. The silicon oxide will be used for the insulating layers between the metal word lines. Other insulators could be used instead of silicon oxide. Other sacrificial materials could be used instead of silicon nitride.

Step 1004 includes etching slits in the alternating silicon oxide ($SiO_2$)/silicon nitride (SiN) layers. Step 1006 includes filling in the slits with insulation. FIG. 4B shows one example of slits 503 for straight NAND strings. FIG. 4A shows one example of slits 408 for U-shaped NAND strings. These insulation filled slits will serve as anchors during a later etching process. The slits may improve mechanical strength of stacked structure, especially when memory holes are opened and used for silicon nitride removal.

Step 1008 includes etching memory holes (MH) in the alternating layers of silicon nitride and silicon oxide. Reactive ion etching can be used to each the memory holes.

Step 1010 includes performing an etch via the memory holes to remove portions of the silicon nitride layers. The etch can involve introducing an etchant via the memory holes, which has a higher selectivity for the silicon nitride, removing the silicon nitride layers. The wet etch is not relatively highly selective of the silicon oxide so that the silicon oxide is not substantially removed. The etch may have a relatively higher selectivity (e.g., by a factor of 1000, or more generally, 100 or more) for the silicon nitride relative than for the silicon oxide.

The wet etch should remove essentially the entire silicon nitride layers wherein the NAND strings are being formed (memory cell area), so that when the regions of the removed silicon nitride are replaced by metal, the metal will extend in substantially the entire layer in the memory cell area. Thus, word line layers at different levels should be isolated from one another and not shorted together. This applies regardless of the etch method, e.g., whether the etchant is introduced via the slits, memory holes, other holes or voids, or combinations thereof. The insulation-filled slits serve as anchors which support the silicon oxide layers when the silicon nitride is removed by etching through memory holes or other holes or voids.

A variety of etching techniques may be used to etch the silicon nitride. Nitride can be etched in one embodiment, by heated or hot phosphoric acid ($H_3PO_4$). As an example, the boiling point of phosphoric acid varies with the concentration of the acid. For example, for a range of acid concentration between 79.5%-94.5% the boiling point may vary from 140° C.-200° C. The etch rate of silicon nitride varies with the temperature and the concentration of the acid. Since the bath is operated at high temperature, water readily evaporates from the solution and the concentration of phosphoric acid changes. Therefore, this may be considered to be a type of "wet" etch. However, a wet etch is not necessarily needed for nitride, as other etching techniques may be applied. In other embodiments, the sacrificial material in the stack may be something other than silicon nitride. Therefore a different type of etch process and etchant may be used.

In the memory array area, the memory holes are placed densely. A minimum density of memory holes allows essentially all silicon nitride in the cell areas to be removed when a wet etch is performed via the memory holes. For example, the memory holes can have a width of 55-80 nanometers (nm) ($55$-$80 \times 10^{-9}$ meters), a pitch of about 110-125 nm ($110$-$125 \times 10^{-9}$ meters) in the word line or x-direction, and a pitch of about 150-165 nm ($150$-$165 \times 10^{-9}$ meters) in the bit line or y-direction. The slits can have a width of about 30-60 nm ($30$-$60 \times 10^{-9}$ meters). As another example, the memory holes can have a width of 85-115 nm ($85$-$115 \times 10^{-9}$ meters), a pitch of about 140-160 nm in the x- and y-directions. The slits can be in the range of about 70-100 nm ($70$-$100 \times 10^{-9}$ meters). These are example ranges of widths and pitches, other ranges could be used. In other areas, such as the word line hook areas at opposing ends of the array, essentially all of the silicon nitride can be removed as well in a wet etch. In those areas, memory holes need not be provided. However, holes referred to as replacement (or inactive) holes may be used to remove silicon nitride. These holes can be arranged with a similar density as in the array.

Step 1012 includes depositing metal (e.g., one or more layers) in the recesses via the memory holes. In one embodiment, the metal is tungsten. This forms a metal/oxide stack. Metal is provided in the memory holes to fill the recesses left when the sacrificial material was removed. Chemical vapor deposition (CVD) or atomic layer deposition (ALD) could be used to deposit the metal.

Step 1014 includes cleaning out the memory holes. The memory holes are cleaned out, e.g., by etching. The slits can be protected from the etching. FIG. 11A shows results after step 1014. FIG. 11A shows alternating metal (SL, SGS, WL1, WL2, WL3, WL4, WL5, WL6, SGD) and insulating layers (D0-D8) in a stack 1100 over a substrate 201. Six memory holes (MH) are depicted as extending vertically through the alternating metal and insulating layers. The memory holes extend down to the source line (SL), which is formed from metal (e.g., tungsten), in one embodiment. An x-y-z coordinate system is depicted, showing that direction of formation. Note that steps 1002-1014 are one way to form vertical memory holes in alternating conductive (word line) layers and insulator layers. However, other techniques can be used.

Figure 11B:
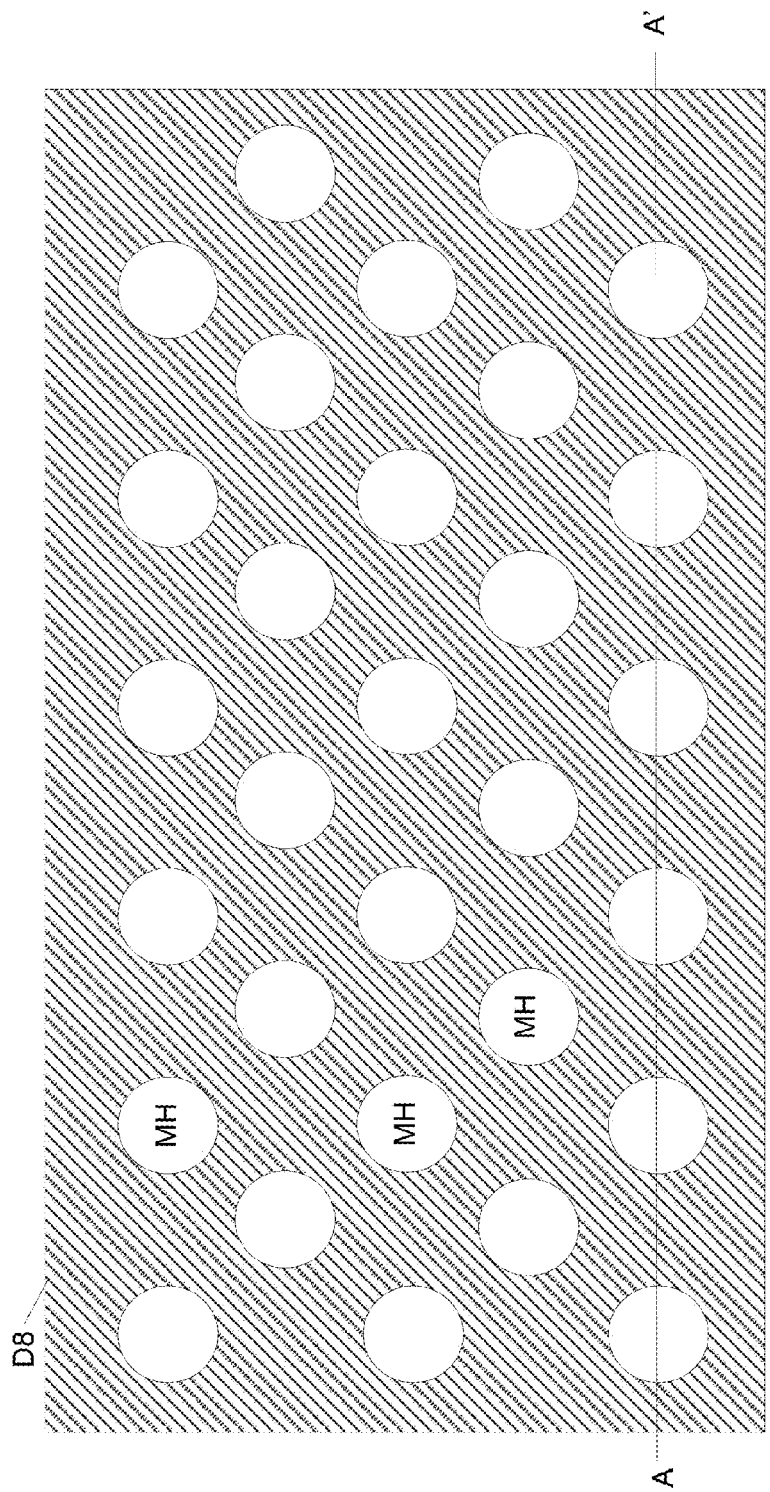
FIGS. 11A-11J shows formation after various steps of the process of FIG. 10.

FIG. 11B shows a top view after step 1014, showing one possible pattern for the memory holes (MH). An x-y-z coordinate system is depicted, showing that direction of formation. In this embodiment, the memory holes are staggered. Note that line A-A' indicates that FIG. 11A is a cross section along line A-A' of FIG. 11B. Also note that the memory holes have a circular cross section in the horizontal direction, in this example. The memory holes are not required to be circular. Further, although this view shows memory holes in layer D8, the pattern may be similar in other layers (D0-D7, SGS, WL0-WL5, and SGD). However, the memory holes could be of different size in the different layers. For example, the memory holes could be smaller at the lower layers.

Step 1016 includes filling in memory holes with oxide-nitride-oxide (ONO). The following describes details of one embodiment of filling memory holes. In one approach, the memory holes are filled in by depositing ONO on sidewalls of the columnar memory holes, e.g., using ALD. In one embodiment, layers such as layers 296-298 are formed in the memory holes (see FIG. 5A-5B). A block oxide can be deposited as layer 296, a nitride such as SiN as a charge trapping layer can be deposited as layer 297, and a tunnel oxide can be deposited as layer 298. The ONO layers form a dielectric stack, in one embodiment. The stack layers can be more complex, such as where at least one of these layers can be a combination of layers of oxide and nitride. One example of ONO is $SiO_2$, SiN, $SiO_2$.

Step 1016 is just one example of the initial filling of the memory holes with other alternatives existing. One option is to add an aluminum oxide layer first, prior to the ONO. Another option is for the tunnel oxide to comprise multiple layers, such as $SiO_2$ and SiON, with the $SiO_2$ nearest the charge trapping region (e.g., SiN). The tunnel oxide might also include $SiO_2$ and ISSG (in-situ steam generation) formed oxide, with the $SiO_2$ nearest the charge trapping region. The tunnel oxide might also include three layers: $SiO_2$, SiON, and ISSG formed oxide. Thus, the layers from outside in could comprise: $Al_2O_3$, $SiO_2$, SiN, $SiO_2$, SiON, ISSG oxide.

Figure 11D:
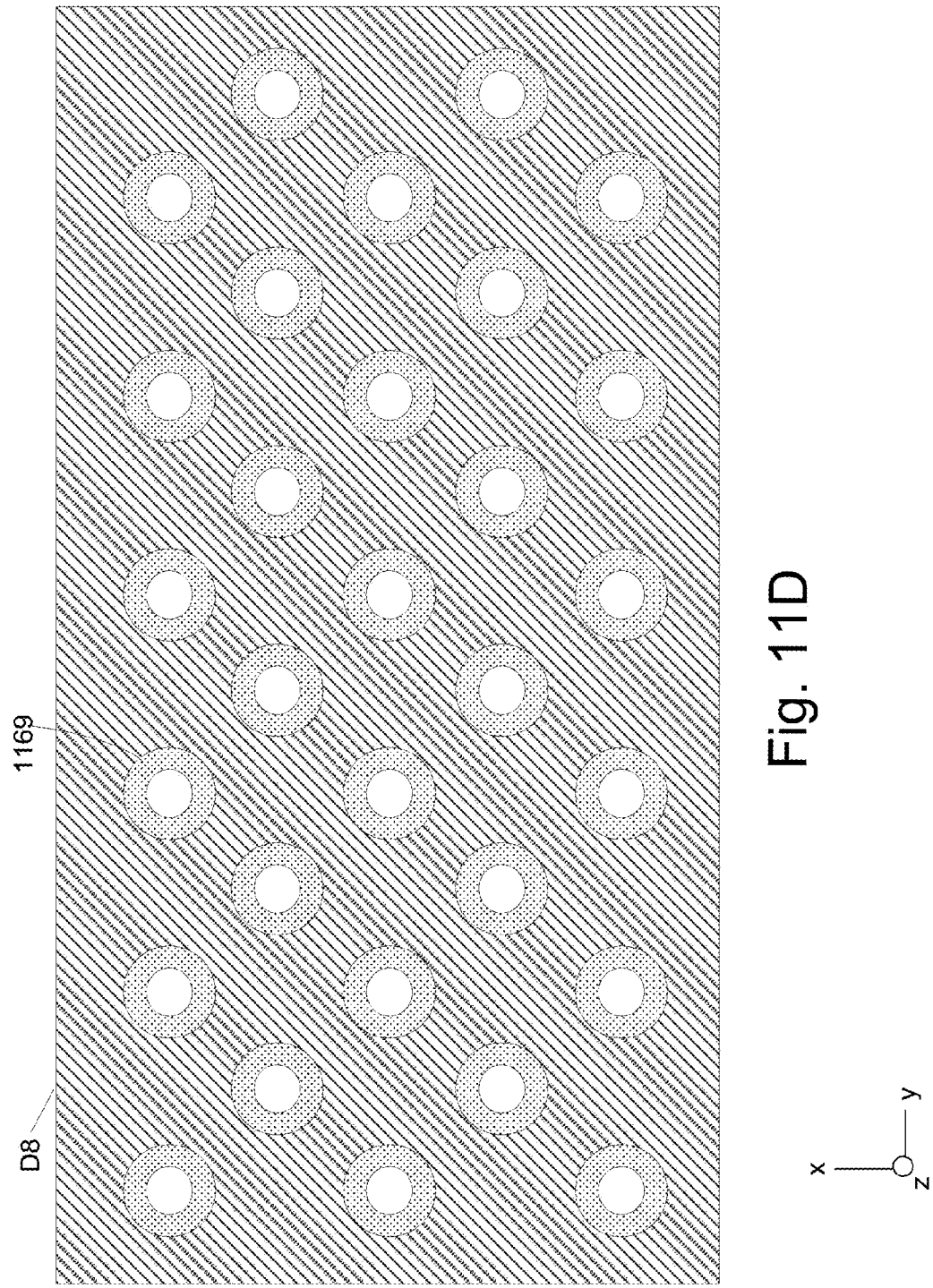

FIG. 11C shows results after step 1016. Layers 269-298 of FIGS. 5A-5B are represented in FIG. 11C by region 1169. As noted, region 1169 could have other layers such as $Al_2O_3$, SiON, and/or ISSG oxide. FIG. 11D shows a top view (horizontal cross section of layer D8) after step 1016, showing region 1169 in the memory holes (MH). Region 1169 is a hollow cylinder, in this example.

Step 1018 is forming a protective layer over the tunnel oxide. The protective layer serves to protect the tunnel oxide when the bottom of the memory hole is etched. One example for the protective layer is LTO (low temperature oxide). The protective layer should have a high etch selectivity with respect to the outermost layer of the tunnel oxide. LTO has a high etch selectivity with respect to both SiON, as well as ISSG formed oxide. A material other than LTO could be used for the protective layer.

Figure 11F:
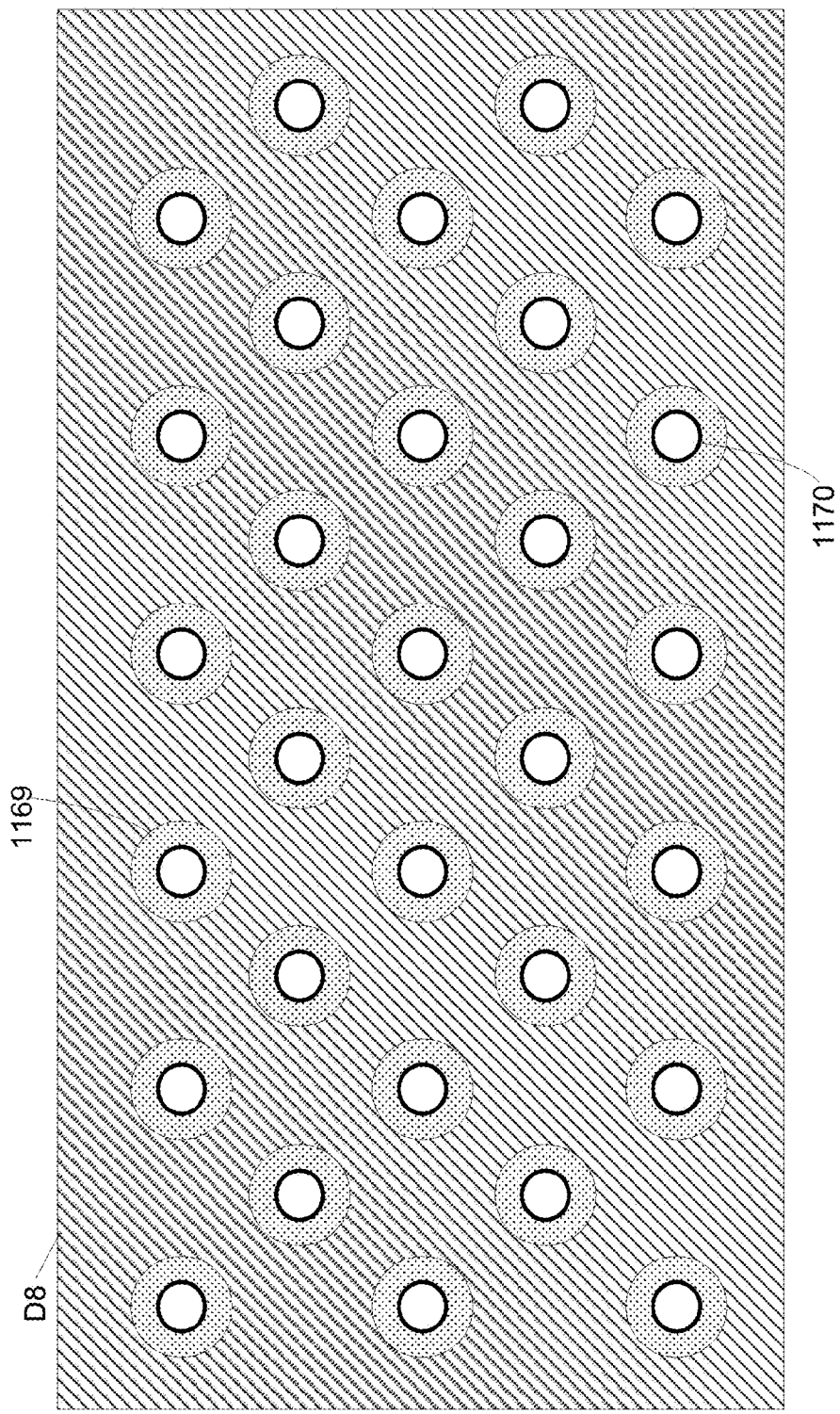

FIGS. 11E and 11F show results after step 1018. These Figures show the protective layer 1170 over region 1169. Recall that the outermost portion of region 1169 is the tunnel oxide. As stated, the outermost portion of the tunnel oxide (in the direction from control gate toward the central axis of symmetry of memory hole) could be SiON or LTO. The LTO is a protective layer. The outermost portion of the tunnel oxide could be SiON or ISSG oxide, in one embodiment. The outermost portion of the tunnel oxide could be $SiO_2$, with a suitable choice for the protective layer 1170.

Figure 11G:
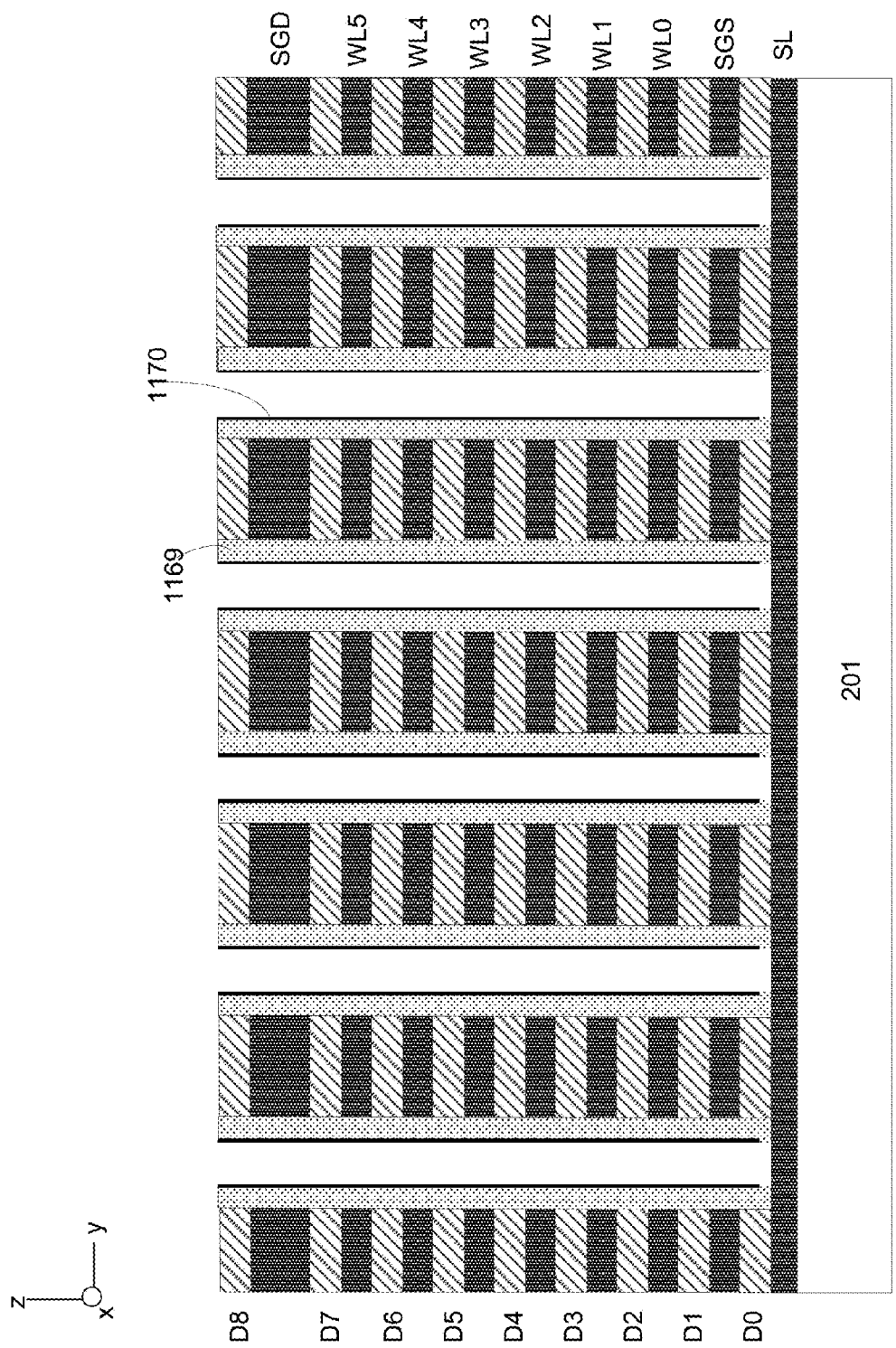

Step 1020 is etching of the bottom of the memory holes. FIG. 11G shows results after step 1020, showing that the memory holes have been etched down to the metal source line (SL). The etching has gone through the protective layer 1170, and through the horizontal portion of the memory layer (e.g., ONO) 1169 at the bottom of the memory holes. However, the protective layer 1170 remains largely in place over region 1169 on the sidewalls of the memory holes, protecting layer 1169 on the sidewalls of memory holes. Thus, the tunnel oxide is protected. The etching also goes through region 1169 at the bottom of the memory holes.

Step 1022 is the removal of the protective layer 1170.

Step 1024 is depositing oxide semiconductor in the memory holes. In one embodiment, the oxide semiconductor is deposited such that it comprises a crystalline structure. Step 1024 includes forming the crystalline structure having an axis that is aligned crystalline with respect to the cylindrical shape of the vertically-oriented channel substantially throughout the vertically-oriented channel. For example, the crystalline structure is formed such that the b-axis is aligned parallel to the inner wall of the memory hole, in one embodiment. Note that the inner wall of the memory hole (after forming region 1169) may have a cylindrical shape. Moreover, the crystalline structure is formed such that the c-axis is aligned perpendicular to the inner wall of the memory hole, in one embodiment. Further details have been described with respect to FIGS. 6A-7C. However, the process of FIG. 10 is not limited to that example crystal structure 600.

Deposition conditions may be as follows for an InGaZnO film. RF and DC PVD may be used with a polycrystalline In—Ga—Zn—O sintered target (e.g., In:Ga:Zn=1:1:1). The deposition temperature may be 250-350 degrees Celsius. The deposition power may be 150-250 Watts. The deposition pressure may be 0.2-0.6 Pascals. The proportion of 02 gas flow to $Ar+O_2$ gas flow may be 50 percent. DC and RF sputtering (e.g., 13.56 MHz) may be performed in the same chamber by switching the power source. In one embodiment, a post deposition anneal is performed. Example parameters for the anneal are 600 degrees Celsius for 30-60 minutes. Other deposition methods can be used, such as, CVD, ALD, or PLD (pulsed laser deposition).

In one embodiment, step 1024 includes forming successive atomic layers in the memory hole from the tunnel dielectric inward. These layers may have a crystalline structure. As one example, the successive atomic layers are ab-layers. Referring to FIGS. 6A and 6B, as one example, successive atomic layers such as the $InO_2$ layer and the (GaZn)O layers are formed. Note that this formation is on a cylindrical surface in the memory hole, in one embodiment. This may result in a number of "virtual" concentric cylinders or cylindrical layers. Step 1024 may form a number of crystal domains without discernable grain boundaries between the domains. The thickness of the oxide semiconductor on the memory hole sidewalls could range from, for example, 10 nm to 25 nm ($10 \times 10^{-9}$ meters to $25 \times 10^{-9}$ meters). However, the oxide semiconductor could be thicker or thinner.

Figure 11H:
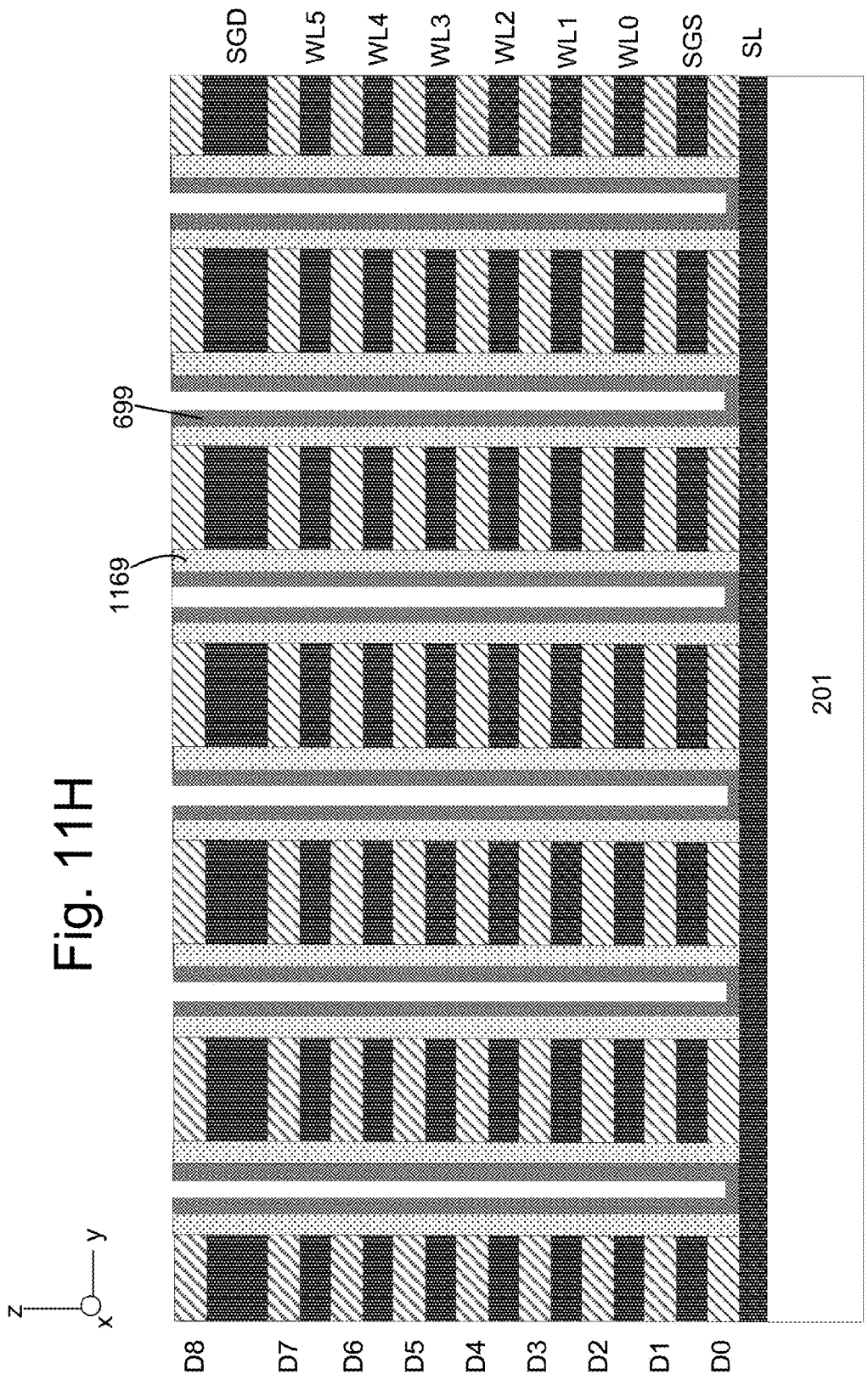
Figure 11L:
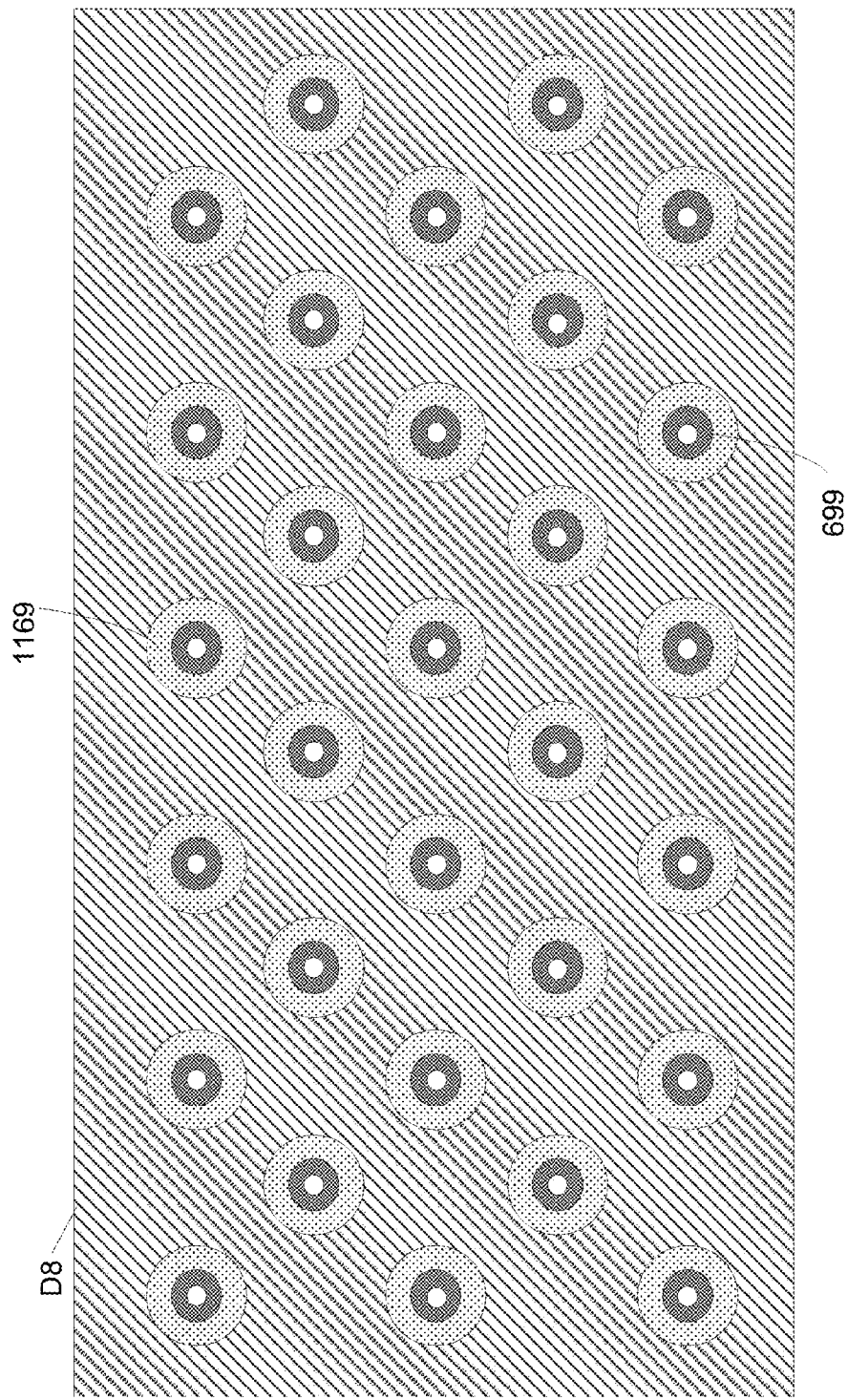

FIGS. 11H and 11I show results after step 1022, showing the oxide semiconductor channel 699 formed in the memory holes over region 1169. FIG. 11H shows that the oxide semiconductor channel 699 is in direct physical and electrical contact with the metal source line (SL). In this example, the oxide semiconductor channel 699 is a conformal layer over region 1169 and also over the metal source line (SL) at the bottom of the memory hole. Note that hole in this example, the bottom portion of the oxide semiconductor contacts all portions of the metal source line at the bottom of the memory for good electrical contact. FIG. 11I shows that a horizontal cross section of the oxide semiconductor channel 699 has a ring shape. The oxide semiconductor channel 699 has a hollow cylindrical shape.

Step 1026 is depositing an $SiO_2$ core in the memory holes (inside the NAND channel).

Step 1028 is forming metal bit line contacts. In one embodiment, an oxide semiconductor drain is formed prior to forming the metal bit line contacts. In one embodiment, the drain is doped. This may reduce series resistance. However, doping is not required. In one embodiment, $NH_3$ plasma is exposed on the drain region. In one embodiment, the drain region is exposed to argon (Ar). Note that whether or not the oxide semiconductor drain is formed, oxide semiconductor is in direct electrical contact with the metal bit line contacts. Also note that there is no need for a polysilicon plug between the vertical NAND channel and the metal bit line contact. Because a polysilicon plug is not needed, the total pillar height can be reduced. Also, bit line capacitance can be reduced, resulting in overall bit line RC delay reduction.

Figure 11J:
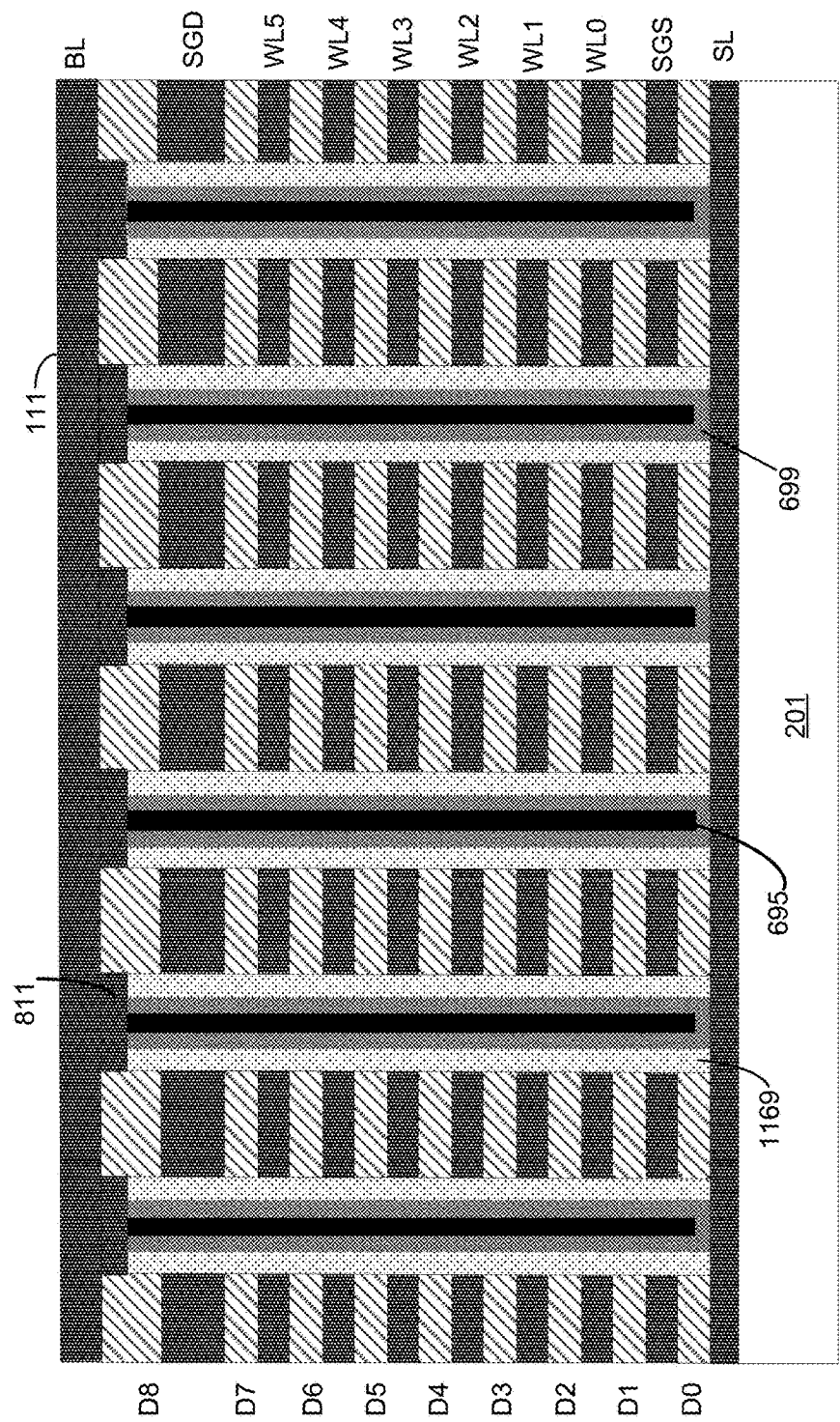

Step 1030 is forming bit lines. FIG. 11J shows results after step 1030. The drain end of each vertical NAND string is in direct physical and electrical contact with the metal bit line contact 811, in this embodiment. Each metal bit line contact 811 is in direct electrical contact with the metal bit line (BL), in this embodiment. The core region 695 is depicted as filling in the central portion of the memory hole (inside the NAND channel).

An alternative the process of FIG. 10 is to perform a wet etch through slits to remove the sacrificial nitride layer. The metal for the word lines can deposited through the slits, as well. Other techniques may also be used to create the alternating word lines and insulating layers.

Figure 12:
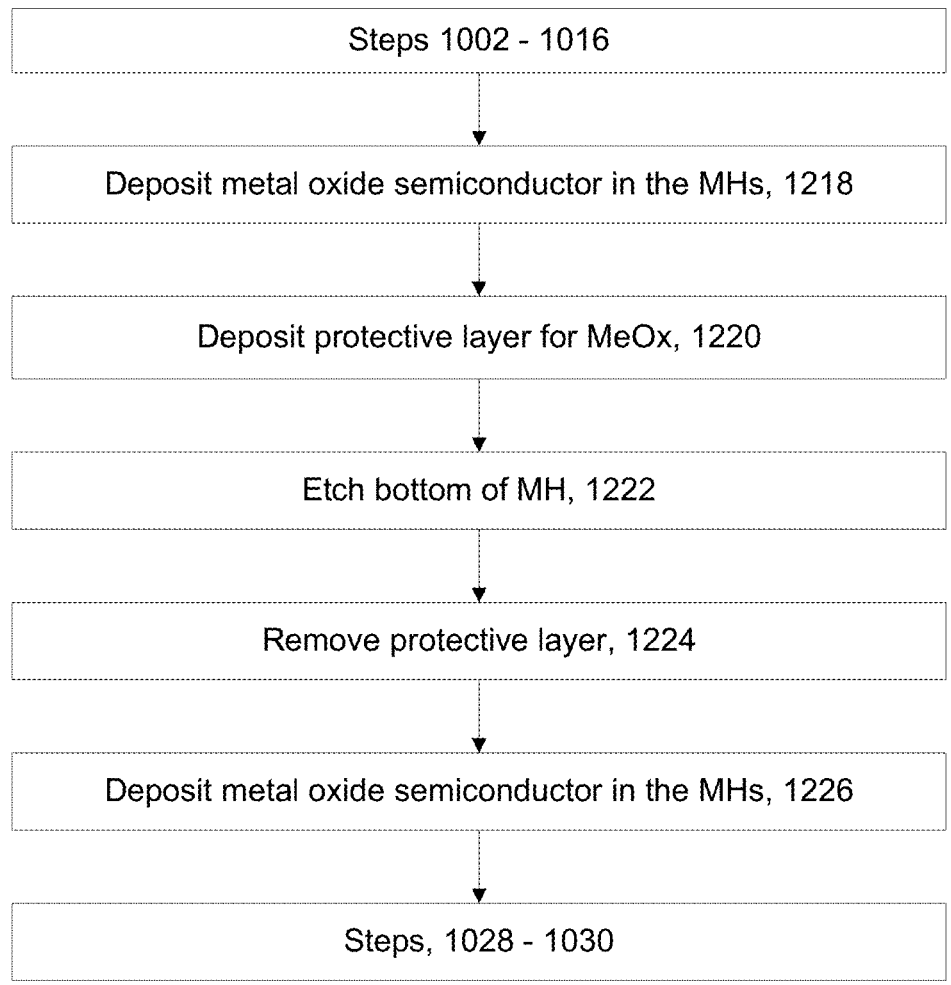
FIG. 12 is an alternative to the process of FIG. 10.

FIG. 12 is an alternative to the process of FIG. 10. In this process, the oxide semiconductor is deposited in two separate steps. FIGS. 13A-13E shows formation after various steps of the process of FIG. 12. FIGS. 13A, 13C, 13D and 13E show vertical NAND string formation from a perspective similar to FIG. 4B. FIG. 13B show a cross section along layer D8.

The process begins similar to that of FIG. 10, by performing steps 1002-1016. Recall the step 1016 was filling in the memory holes with oxide-nitride-oxide (ONO). FIG. 11C shows results after step 1016.

In step 1218 of FIG. 12, oxide semiconductor is deposited on the side walls of the memory holes. This step may be similar to step 1024 of FIG. 10. Thus, the deposition conditions described in step 1024 may be used in step 1218. However, the oxide semiconductor is not necessarily as thick in step 1218. An example range of thickness for the oxide semiconductor in step 1218 is 5 nanometers (nm) to 10 nm ($5 \times 10^{-9}$ meters to $10 \times 10^{-9}$ meters). However, the layer could be thicker or thinner.

Figure 13A:
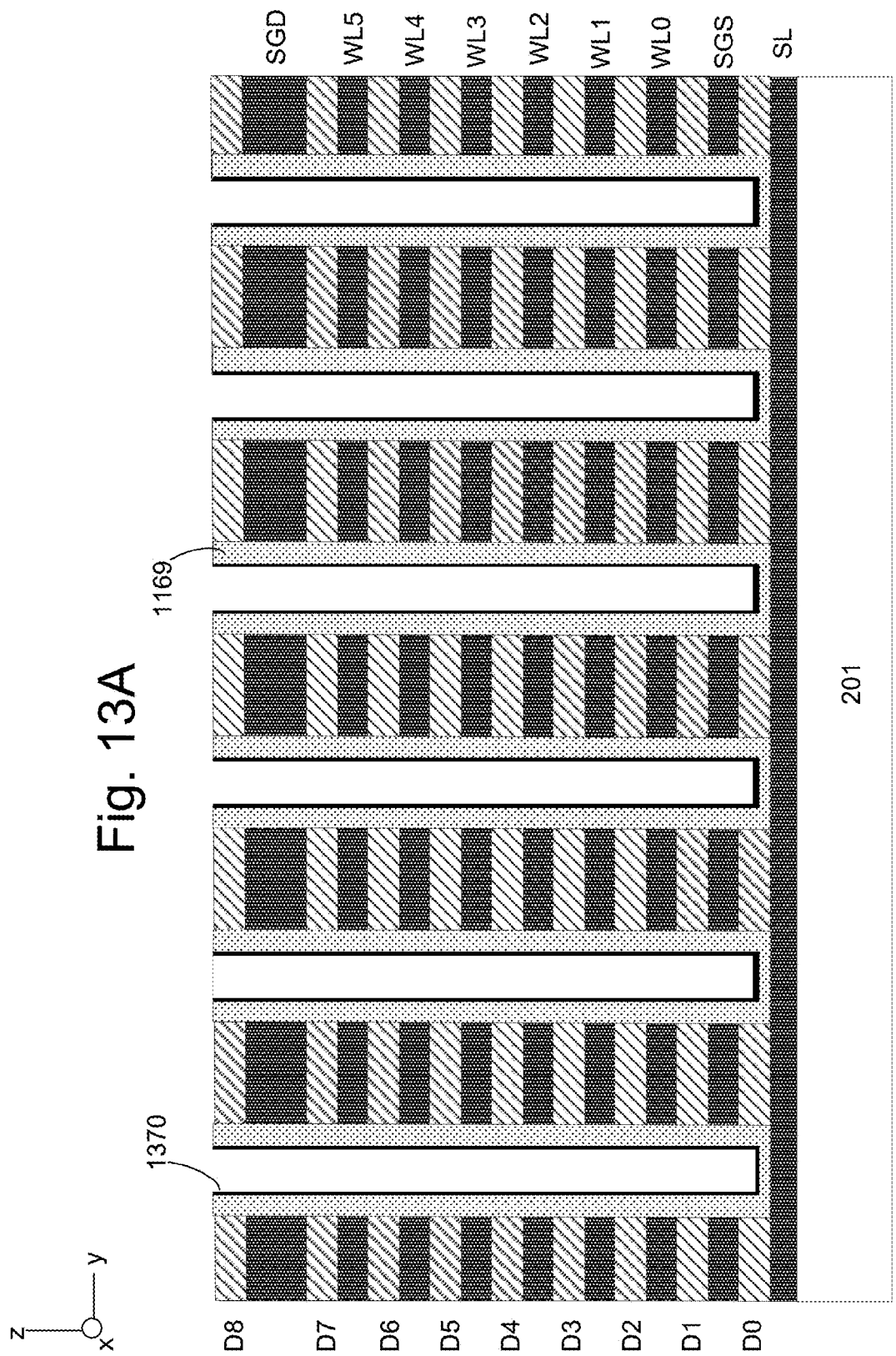
FIGS. 13A-13E shows formation after various steps of the process of FIG. 12.
Figure 13B:
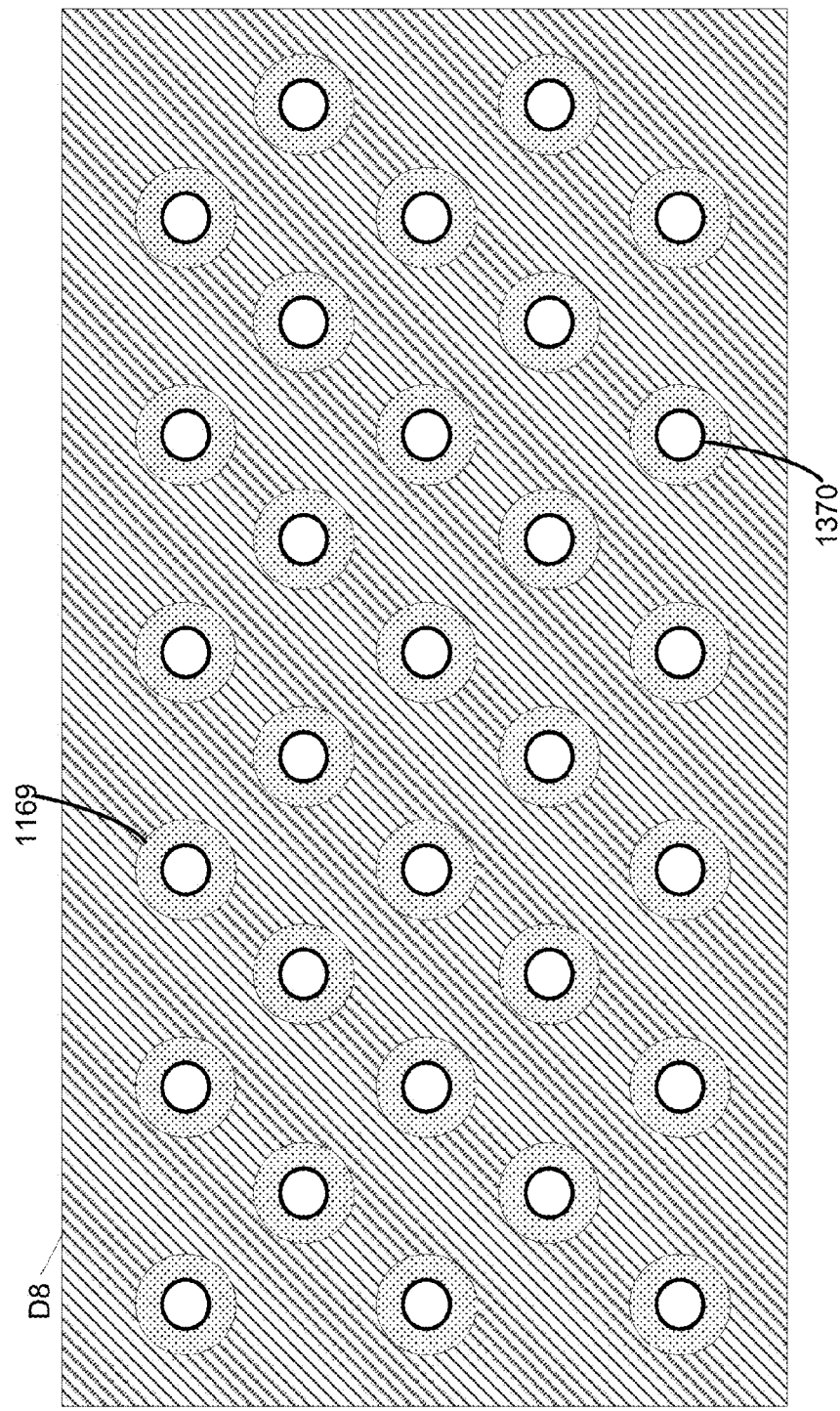

FIGS. 13A and 13B depict results after step 1218. Those Figures depicts the oxide semiconductor layer 1370, which covers the side walls of layer 1169. Recall that layer 1169 represents that various layers of the memory cells, such as the ONO.

In step 1220, a protective layer is deposited over the oxide semiconductor layer. This will serve to protect the oxide semiconductor when etching the bottom of the memory hole. One example for the protective layer is LTO (low temperature oxide). Another example for the protective layer is amorphous silicon (a-Si). The protective layer should have a high etch selectivity with respect to the oxide semiconductor.

Figure 13C:
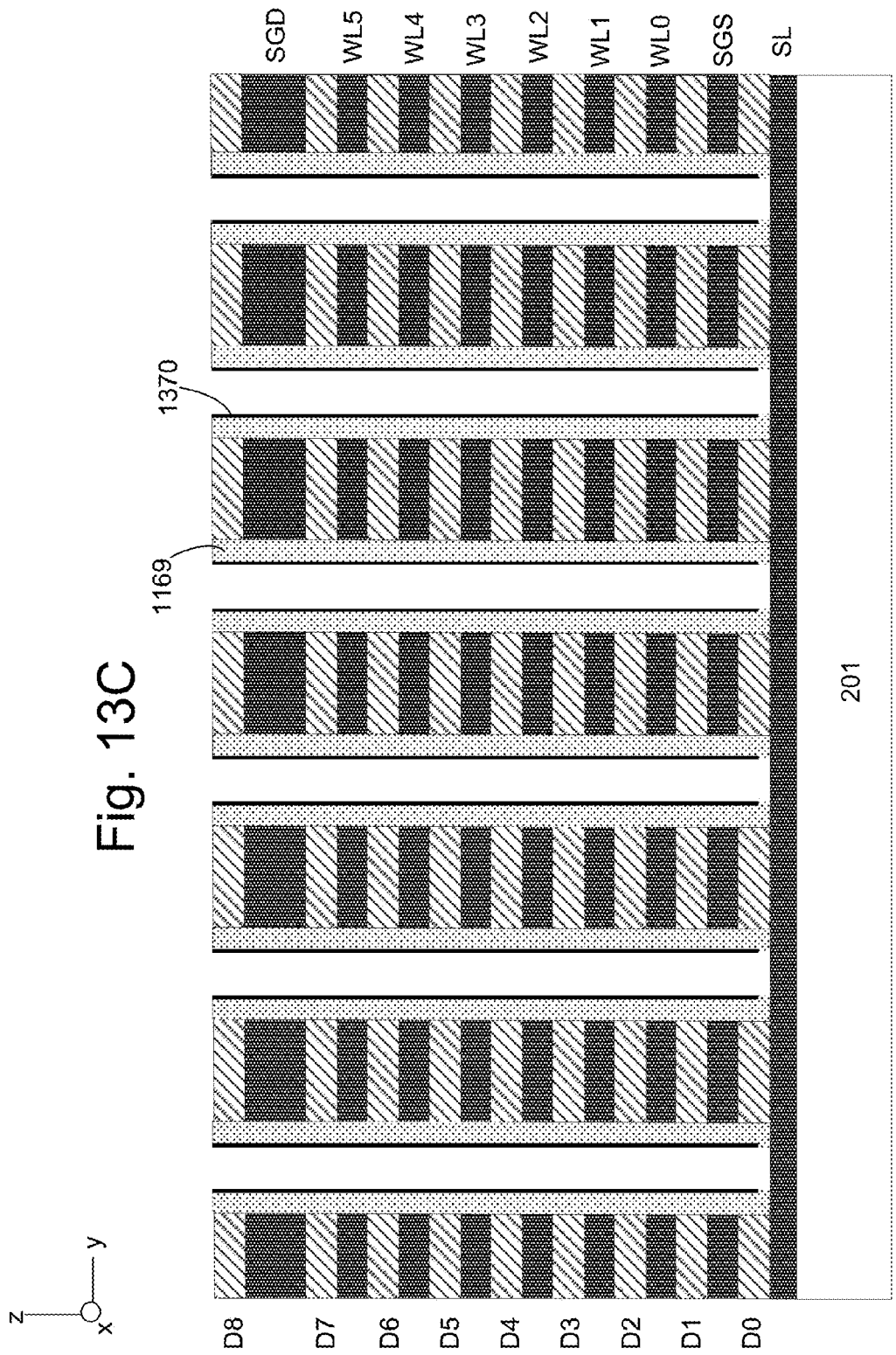

Step 1222 is to etch the bottom of the memory holes. Step 1222 may be similar to step 1020 from FIG. 10. Step 1224 is to remove the protective layer. Results after step 1224 are depicted in FIG. 13C, which shows that the memory holes have been etched down to the metal source line (SL). The oxide semiconductor layer 1370 is still in place.

Step 1226 is depositing oxide semiconductor in the memory holes. This step may be similar to step 1024 from FIG. 10. Deposition conditions may be similar to step 1024. However, in step 1226 a second layer of oxide semiconductor is being deposited over the first layer of oxide semiconductor (from step 1218). An example range of thickness for the second oxide semiconductor layer is 5 nanometers (nm) to 15 nm ($5 \times 10^{-9}$ meters to $15 \times 10^{-9}$ meters). However, this second layer could be thicker or thinner. The total thickness of the oxide semiconductor from steps 1218 and 1226 could range from, for example, 10 nm to 25 nm ($10 \times 10^{-9}$ meters to $25 \times 10^{-9}$ meters). However, the total thickness could be thicker or thinner.

Figure 13D:
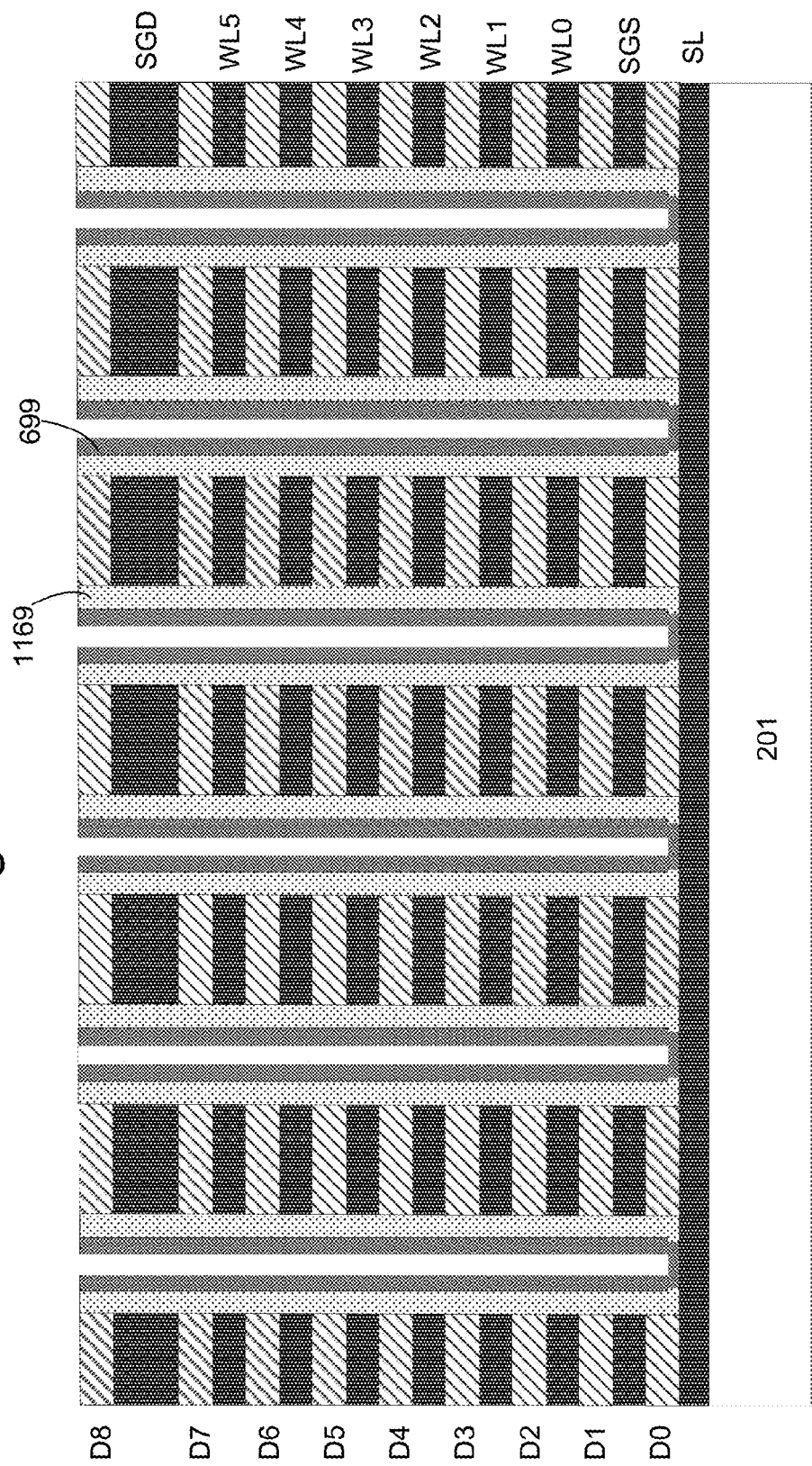

Results after step 1226 are depicted in FIG. 13D, which shows that oxide semiconductor layer now forms the vertical NAND channel 699. Similar to the embodiment in FIG. 11H, the oxide semiconductor layer has good electrical contact with the metal source line at the bottom of the memory hole. However, in this embodiment, the horizontal portion of oxide semiconductor at the bottom of the memory hole is the result of two depositions of the oxide semiconductor. The top view may be similar to that of FIG. 11I.

Figure 13E:
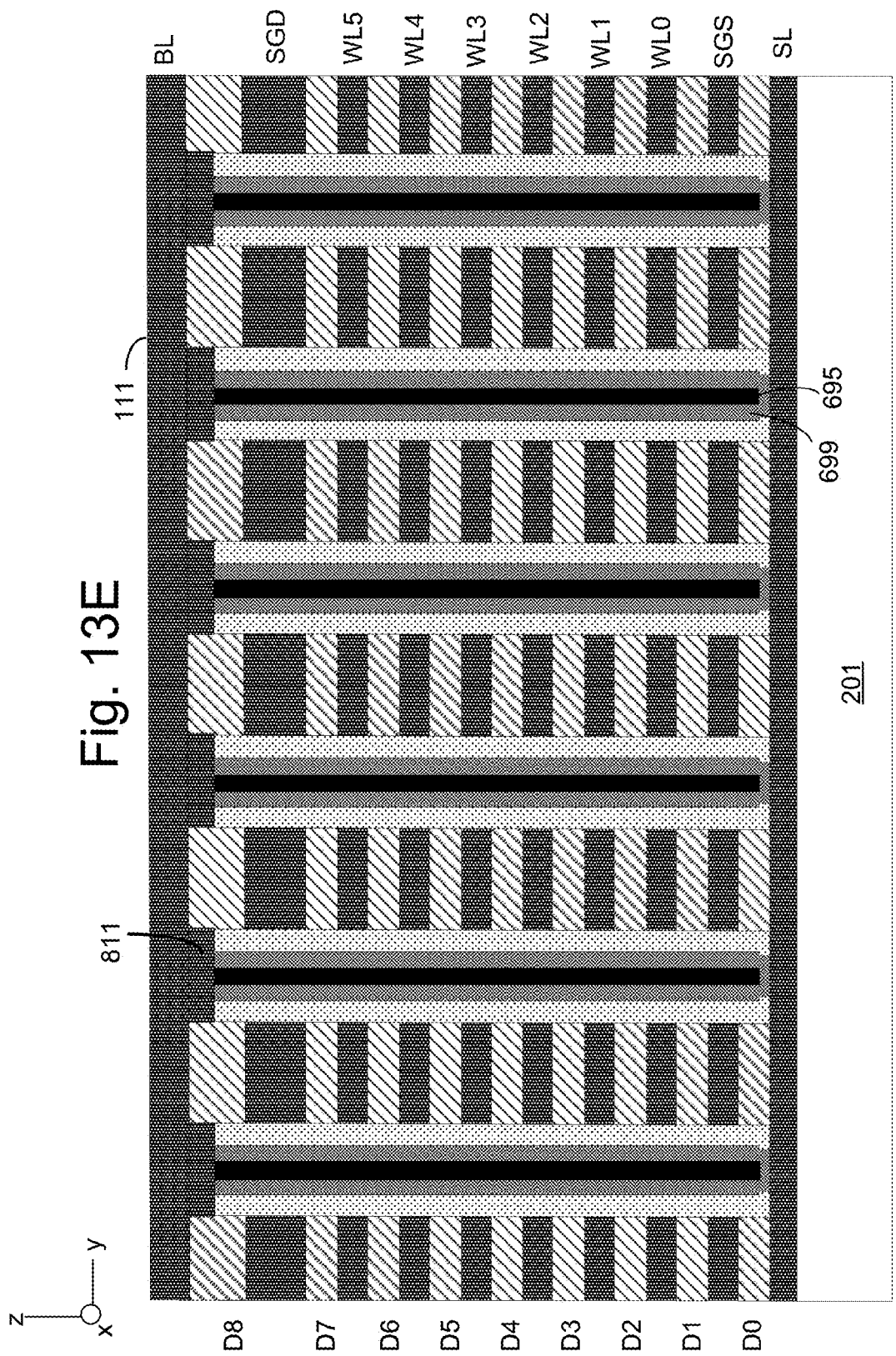

The process can conclude using steps 1028-1030 from FIG. 10. Recall that these steps filled in the core of the NAND channel (step 1026), formed metal bit line contacts (step 1028) and formed bit lines (step 1030). Results are depicted in FIG. 13E, which the core 695, the metal bit line contact 811 and the bit line (BL) 111.

There are numerous variations to the processes of FIGS. 10 and 12. In FIGS. 10 and 12, the metal for the word line layers was deposited prior to filling in the memory holes. In another embodiment, the metal for the word line layers is deposited after filling in the memory holes. For example, steps 1010 and 1012 could be skipping in FIG. 10. Then, after filling the memory holes as in steps 1016-1026, the slits can opened with an etch. Then, an etch can be performed through the slits to remove a sacrificial nitride layer (similar to step 1010, but the etch is through the slits instead of the memory holes). Then, metal for the word line layers is deposited through the slits (similar to step 1012, but the deposit is through the slits instead of the memory holes). The slits can then be re-filled with an insulator. A similar modification can be made to the process of FIG. 12.

One embodiment disclosed herein includes a three-dimensional (3D) non-volatile storage device, comprising a substrate, a plurality of conductive layers above the substrate, a plurality of insulator layers alternating with the conductive layers in a stack above the substrate, and a three-dimensional memory array comprising a plurality of vertically-oriented NAND strings extending through the conductive layers and insulator layers above the substrate. Each vertically-oriented NAND string comprises a plurality of non-volatile storage elements and a vertically-oriented cylindrically shaped channel. The vertically-oriented cylindrically shaped channel comprises an oxide semiconductor having a crystalline structure. The crystalline structure has an axis that is aligned crystalline with respect to the cylindrical shape of the vertically-oriented channel substantially throughout the vertically-oriented channel.

In one embodiment, the channel of the memory device of the previous paragraph extends in a first direction from top to bottom of the vertically-oriented cylindrically shaped channel. The axis of the crystalline structure that is aligned with respect to the cylindrical shape of the vertically-oriented channel substantially throughout the vertically-oriented channel is aligned parallel to the first direction.

In one embodiment, the vertically-oriented cylindrically shaped channel of the memory device of either of the two previous paragraphs has a cylindrical surface that is adjacent to the plurality of non-volatile storage elements. The axis of the crystalline structure that is aligned with respect to the cylindrical shape of the vertically-oriented channel substantially throughout the vertically-oriented channel is aligned perpendicular to the cylindrical surface.

In one embodiment, the vertically-oriented cylindrically shaped channel of the memory device of any of the three previous paragraphs comprises a plurality of concentric cylindrical layers. The crystalline structure comprises a plurality of crystalline layers. The plurality of crystalline layers are substantially aligned with the concentric cylindrical layers.

In one embodiment, the vertically-oriented cylindrically shaped channel of the memory device of any of the four previous paragraphs has a plurality of bit lines and a plurality of metal bit line contacts. Each of the plurality of vertically-oriented NAND strings is associated with a bit line of the plurality of bit lines. Each of the metal bit line contacts electrically connects one of the bit lines with a channel of one of the NAND strings. The oxide semiconductor of the channel of a given NAND string is in direct electrical contact with its respective metal bit line contact.

In one embodiment, the vertically-oriented cylindrically shaped channel of the memory device of any of the five previous paragraphs has a metal source line that is associated with a group of the plurality of vertically-oriented NAND strings. The oxide semiconductor of the channels of the group of NAND string is in direct electrical contact with the metal source line.

One embodiment disclosed herein includes a method of forming a 3D non-volatile storage device. The method comprises forming a plurality of insulator layers above a substrate, forming a plurality of conductive layers alternating with the insulator layers in a stack above the substrate, and forming a three-dimensional memory array comprising a plurality of vertically-oriented NAND strings above the substrate. Each vertically-oriented NAND string comprises a plurality of non-volatile storage elements and a vertically-oriented cylindrically shaped channel. Forming the three-dimensional memory array comprises forming the vertically-oriented cylindrically shaped channel from an oxide semiconductor having a crystalline structure having an axis that is aligned crystalline with respect to the cylindrical shape of the vertically-oriented channel substantially throughout the vertically-oriented channel.

One embodiment disclosed herein includes a three-dimensional (3D) non-volatile storage device, comprising a substrate, a plurality of horizontal conductive word lines layers above the substrate, a plurality of horizontal insulator layers alternating with the conductive word line layers in a stack above the substrate, and a plurality of vertically-oriented NAND strings that reside in memory holes in the plurality of conductive word lines layers and the plurality of insulator layers. Each vertically-oriented NAND string comprises a vertically-oriented channel and a plurality of non-volatile storage elements that surround the vertically-oriented channel. The vertically-oriented channel comprises an oxide semiconductor having one or more crystal domains having a crystalline structure. The vertically-oriented channel has a cylindrical surface that is adjacent to the plurality of non-volatile storage elements. The cylindrical shape has a longitudinal axis from bottom to top of the memory holes that defines a longitudinal direction and a radial axis that is perpendicular to the cylindrical surface that defines a radial direction. Substantially all of the one or more crystal domains have an axis that is aligned crystalline in at least the longitudinal direction or the radial direction.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A three-dimensional (3D) non-volatile storage device, comprising:
   a substrate;
   a plurality of conductive layers above the substrate;
   a plurality of insulator layers alternating with the conductive layers in a stack above the substrate; and
   a three-dimensional memory array comprising a plurality of vertically-oriented NAND strings extending through the conductive layers and insulator layers above the substrate, each vertically-oriented NAND string comprising a plurality of non-volatile storage elements and a vertically-oriented cylindrically shaped channel, the vertically-oriented cylindrically shaped channel comprising an oxide semiconductor having a crystalline structure, the crystalline structure having an axis that is aligned crystalline with respect to the cylindrical shape of the vertically-oriented channel substantially throughout the vertically-oriented channel.

2. The three-dimensional (3D) non-volatile storage device of claim 1, wherein the channel extends in a vertical direction, wherein the axis of the crystalline structure that is aligned with respect to the cylindrical shape of the vertically-oriented channel substantially throughout the vertically-oriented channel is aligned parallel to the vertical direction.

3. The three-dimensional (3D) non-volatile storage device of claim 1, wherein the vertically-oriented cylindrically shaped channel has a cylindrical surface that is adjacent to the plurality of non-volatile storage elements, wherein the axis of the crystalline structure that is aligned with respect to the cylindrical shape of the vertically-oriented channel substantially throughout the vertically-oriented channel is aligned perpendicular to the cylindrical surface.

4. The three-dimensional (3D) non-volatile storage device of claim 1, wherein the cylindrical shape of the channel comprises a plurality of concentric cylindrical layers, the crystalline structure comprising a plurality of crystalline layers, wherein the plurality of crystalline layers are substantially aligned with the concentric cylindrical layers.

5. The three-dimensional (3D) non-volatile storage device of claim 1, wherein the oxide semiconductor comprises InGaZnO.

6. The three-dimensional (3D) non-volatile storage device of claim 1, further comprising:
   a plurality of bit lines, each of the plurality of vertically-oriented NAND strings is associated with a bit line of the plurality of bit lines; and
   a plurality of metal bit line contacts, wherein each of the metal bit line contacts electrically connects one of the bit lines with a channel of one of the NAND strings, wherein the oxide semiconductor of the channel of a given NAND string is in direct electrical contact with its respective metal bit line contact.

7. The three-dimensional (3D) non-volatile storage device of claim 1, further comprising:
   a metal source line that is associated with a group of the plurality of vertically-oriented NAND strings, wherein the oxide semiconductor of the channels of the group of NAND strings is in direct electrical contact with the metal source line.

8. The three-dimensional (3D) non-volatile storage device of claim 1, wherein the plurality of non-volatile storage elements each comprise an information storage region that comprises a nitride charge trapping region.

9. The three-dimensional (3D) non-volatile storage device of claim 1, wherein the crystalline structure of the oxide semiconductor is a single crystal substantially throughout the entire NAND channel.

10. The three-dimensional (3D) non-volatile storage device of claim 1, wherein the oxide semiconductor comprises a plurality of crystal domains, substantially all of the crystal domains have a first axis that is aligned with respect to the cylindrical shape of the vertically-oriented channel.

11. A method of forming a 3D non-volatile storage device, the method comprising:
   providing a substrate;
   forming a plurality of insulator layers above the substrate;
   forming a plurality of conductive layers alternating with the insulator layers in a stack above the substrate; and
   forming a three-dimensional memory array comprising a plurality of vertically-oriented NAND strings extending through the conductive layers and insulator layers above the substrate, each vertically-oriented NAND string comprising a plurality of non-volatile storage elements and a vertically-oriented cylindrically shaped channel, comprising forming the vertically-oriented cylindrically shaped channel from an oxide semiconductor having a crystalline structure, the crystalline structure having an axis that is aligned crystalline with respect to the cylindrical shape of the vertically-oriented channel substantially throughout the vertically-oriented channel.

12. The method of claim 11, wherein forming the three-dimensional memory array comprising the plurality of vertically-oriented NAND strings above the substrate comprises:
   forming vertical memory holes in a plurality of horizontal layers above the substrate, the memory holes having side walls;
   depositing material for the non-volatile storage elements on the side walls of the vertical memory holes leaving channel holes having side walls; and
   depositing a film of the oxide semiconductor on the side walls of the channel holes.

13. The method of claim 12, wherein the material for the non-volatile storage elements on the side walls of the vertical memory holes comprises:
   a blocking layer, a charge trapping layer, and a tunneling layer.

14. The method of claim 13, wherein the blocking layer comprises aluminum oxide and silicon oxide, the charge trapping layer comprises silicon nitride, and the tunneling layer comprises a stack of oxide, nitride, and oxide films.

15. The method of claim 11, wherein each of the vertically-oriented NAND strings comprises a drain end, wherein forming the three-dimensional memory array comprising the plurality of vertically-oriented NAND strings above the substrate comprises:
   forming a metal bit line contact in direct electrical contact with the oxide semiconductor at the drain end of the vertically-oriented NAND strings.

16. The method of claim 11, wherein forming the three-dimensional memory array comprising the plurality of vertically-oriented NAND strings above the substrate comprises:
   forming a metal source line that is associated with a group of the plurality of the vertically-oriented NAND strings, the plurality of the vertically-oriented NAND strings each having a source end; and
   forming the oxide semiconductor at the source end of group of vertically-oriented NAND strings in direct electrical contact with the metal source line.

17. The method of claim 11, wherein forming the vertically-oriented cylindrically shaped channel from an oxide semiconductor having a crystalline structure having an axis (a, b, or c) that is aligned crystalline with respect to the cylindrical shape of the vertically-oriented channel substantially throughout the vertically-oriented channel comprises:
   forming the crystalline structure of the oxide semiconductor as a substantially cylindrical shape having a cylindrical surface that is adjacent to the plurality of non-volatile storage elements, the crystalline structure having a radial axis that is perpendicular to the cylindrical surface, including forming the crystalline structure having a first axis that is substantially parallel to the radial axis substantially throughout the vertically-oriented channel.

18. The method of claim 11, wherein forming the vertically-oriented cylindrically shaped channel from an oxide semiconductor having a crystalline structure having an axis (a, b, or c) that is aligned crystalline with respect to the cylindrical shape of the vertically-oriented channel substantially throughout the vertically-oriented channel comprises:
   forming the crystalline structure of the oxide semiconductor as a substantially cylindrical shape having a longitudinal axis that is substantially parallel to a first direction that the non-volatile storage elements extend from top to bottom of the channel, including forming the crystalline structure having a first axis that is substantially parallel to the longitudinal axis substantially throughout the vertically-oriented channel.

19. The method of claim 11, wherein the cylindrical shape of the channel comprises a plurality of concentric cylindrical layers, wherein forming the vertically-oriented cylindrically shaped channel from an oxide semiconductor having a crystalline structure having an axis (a, b, or c) that is aligned crystalline with respect to the cylindrical shape of the vertically-oriented channel substantially throughout the vertically-oriented channel comprises:
   forming the crystalline structure of the oxide semiconductor with a plurality of crystalline layers that are substantially aligned with the concentric cylindrical layers.

20. The method of claim 11, wherein forming the vertically-oriented cylindrically shaped channel from an oxide semiconductor comprises:
   forming the oxide semiconductor from InGaZnO.

21. A three-dimensional (3D) non-volatile storage device, comprising:
   a substrate;
   a plurality of horizontal conductive word lines layers above the substrate;
   a plurality of horizontal insulator layers alternating with the conductive word line layers in a stack above the substrate; and
   a plurality of vertically-oriented NAND strings that reside in memory holes in the plurality of conductive word lines layers and the plurality of insulator layers, each vertically-oriented NAND string comprising a cylindrically shaped vertically-oriented channel and a plurality of non-volatile storage elements that surround the vertically-oriented channel, the vertically-oriented channel comprising an oxide semiconductor having one or more crystal domains having a crystalline structure, the vertically-oriented channel having a cylindrical surface that is adjacent to the plurality of non-volatile storage elements, the cylindrical shape having a longitudinal axis from bottom to top of the memory holes that defines a longitudinal direction and a radial axis that is perpendicular to the cylindrical surface that defines a radial direction, substantially all of the one or more crystal domains having an axis that is aligned crystalline in at least the longitudinal direction or the radial direction such that there is not a discernable grain boundary between the one or more crystal domains.

22. The three-dimensional (3D) non-volatile storage device of claim 21, wherein the axis of the crystal domains that are aligned crystalline are in the radial direction.

23. The three-dimensional (3D) non-volatile storage device of claim 21, wherein the axis of the crystal domains that are aligned crystalline are in the longitudinal direction.

24. The three-dimensional (3D) non-volatile storage device of claim 21, wherein the cylindrical shape comprises a plurality of concentric cylindrical layers, the oxide semiconductor comprising a plurality of crystalline segments each having a first axis and a second axis, wherein the first axis of the respective crystalline segments are substantially tangent to a horizontal cross section of the concentric cylindrical layers, wherein the second axis of the respective crystalline segments are substantially parallel to the concentric cylindrical layers in the longitudinal direction.

25. The three-dimensional (3D) non-volatile storage device of claim 24, wherein a third axis of the respective crystalline segments is perpendicular to the plurality of concentric cylindrical layers.

* * * * *